(12) United States Patent
Fang

(10) Patent No.: US 11,195,771 B2
(45) Date of Patent: Dec. 7, 2021

(54) SUBSTRATE STRUCTURE OF SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Hsu-Nan Fang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/705,002

(22) Filed: Dec. 5, 2019

(65) Prior Publication Data

US 2021/0175139 A1 Jun. 10, 2021

(51) Int. Cl.
*H01L 23/31* (2006.01)
*H01L 23/00* (2006.01)
*H01L 23/433* (2006.01)
*H01L 23/16* (2006.01)
*H01L 21/768* (2006.01)
(Continued)

(52) U.S. Cl.
CPC ........ *H01L 23/3121* (2013.01); *H01L 21/568* (2013.01); *H01L 21/76895* (2013.01); *H01L 23/16* (2013.01); *H01L 23/4334* (2013.01); *H01L 23/562* (2013.01); *H01L 24/03* (2013.01);
(Continued)

(58) Field of Classification Search
CPC ......... H01L 23/16; H01L 23/18; H01L 23/28; H01L 23/3135; H01L 23/34; H01L 23/345; H01L 23/36; H01L 23/42; H01L 23/433; H01L 23/4334; H01L 21/565–568; H01L 23/562; H01L 2224/02; H01L 2224/023; H01L 2224/0231; H01L 2224/0233–02331; H01L 2224/0235–02372; H01L 23/485; H01L 23/522–5228; H01L 23/538; H01L 24/05; H01L 24/06; H01L 24/30; H01L 24/80–91; H01L 23/3121; H01L 23/3142; H01L 23/3178; H01L 2224/02371; H01L 23/498–49894; H01L 23/49838–49844; H01L 23/3114; H01L 24/94; H01L 2224/94; H01L 23/31–3157
See application file for complete search history.

(56) References Cited

U.S. PATENT DOCUMENTS

2015/0170937 A1* 6/2015 Yu ..................... H01L 23/3114
257/738
2015/0228632 A1* 8/2015 Yu ........................... H01L 24/18
257/704
(Continued)

OTHER PUBLICATIONS

Miyairi, Ken, "Organic interposer, 2.5D structure like development for MCM and Heterogeneous packaging", SiP Conference China 2018, Oct. 17-19, 2018, 14 pages.

*Primary Examiner* — Sonya McCall-Shepard
(74) *Attorney, Agent, or Firm* — Foley & Lardner LLP

(57) ABSTRACT

A substrate structure includes a substrate, an encapsulating layer and a redistribution structure. The substrate has a first surface. The encapsulating layer surrounds the substrate and has a first surface. The redistribution structure is disposed on the first surface of the substrate and the first surface of the encapsulating layer. A gap exists in elevation between the first surface of the substrate and the first surface of the encapsulating layer.

19 Claims, 27 Drawing Sheets

(51) Int. Cl.
*H01L 21/56* (2006.01)
*H01L 21/683* (2006.01)
*H01L 23/42* (2006.01)
*H01L 23/498* (2006.01)

(52) U.S. Cl.
CPC ...... *H01L 24/05* (2013.01); *H01L 2224/0237* (2013.01)

(56) References Cited

U.S. PATENT DOCUMENTS

2019/0237423 A1* 8/2019 Chen .................. H01L 24/24
2021/0066263 A1* 3/2021 Chen .................. H01L 21/568

* cited by examiner

SUBSTRATE STRUCTURE OF SEMICONDUCTOR DEVICE PACKAGE AND METHOD OF MANUFACTURING THE SAME

BACKGROUND

1. Field of the Disclosure

The present disclosure generally relates to a substrate structure and, in particular, to a substrate structure including a substrate and a redistribution structure, and to a method of manufacturing the substrate structure.

2. Description of the Related Art

A semiconductor device package may include a substrate and a redistribution structure attached to the substrate. The redistribution structure is generally held by a carrier. After the redistribution structure is attached to the substrate, the carrier together with the redistribution structure is cut to facilitate a single die to be formed on the singulated redistribution structure. The carrier is then removed. Subsequently, a drilling process is conducted to define vias in the redistribution structure for electrical connection with the substrate.

SUMMARY

Embodiments of the present disclosure provide a substrate structure. The substrate structure includes a substrate having a first surface, an encapsulating layer surrounding the substrate and having a first surface, and a redistribution structure disposed on the first surface of the substrate and the first surface of the encapsulating layer. A gap exists in elevation between the first surface of the substrate and the first surface of the encapsulating layer.

Embodiments of the present disclosure also provide a substrate structure. The substrate structure includes a substrate having a first surface, an encapsulating layer surrounding the substrate and having a first surface, a support ring sealed in the encapsulating layer, surrounding the substrate and having a first surface, and a redistribution structure disposed on the first surface of the substrate, the first surface of the encapsulating layer and the first surface of the support ring. A gap exists in elevation between the first surface of the substrate and the first surface of the encapsulating layer.

Some embodiments of the present disclosure provide a method of manufacturing a substrate structure. The method includes providing a carrier for supporting semiconductor packages to be formed thereon, providing a substrate having a first surface and a second surface opposite to the first surface, the substrate including a conductive layer on the first surface, and contact pads in electrical connection with the conductive layer, attaching the substrate at the second surface thereof to the carrier, forming an encapsulating layer on the carrier, covering the substrate, reducing the encapsulating layer in height, resulting in a reduced encapsulating layer having a first surface level with the conductive layer on the first surface of the substrate, removing the conductive layer, exposing the contact pads beneath the first surface of the substrate, wherein a gap exists in elevation between the first surface of the reduced encapsulating layer and the first surface of the substrate, and removing the carrier.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
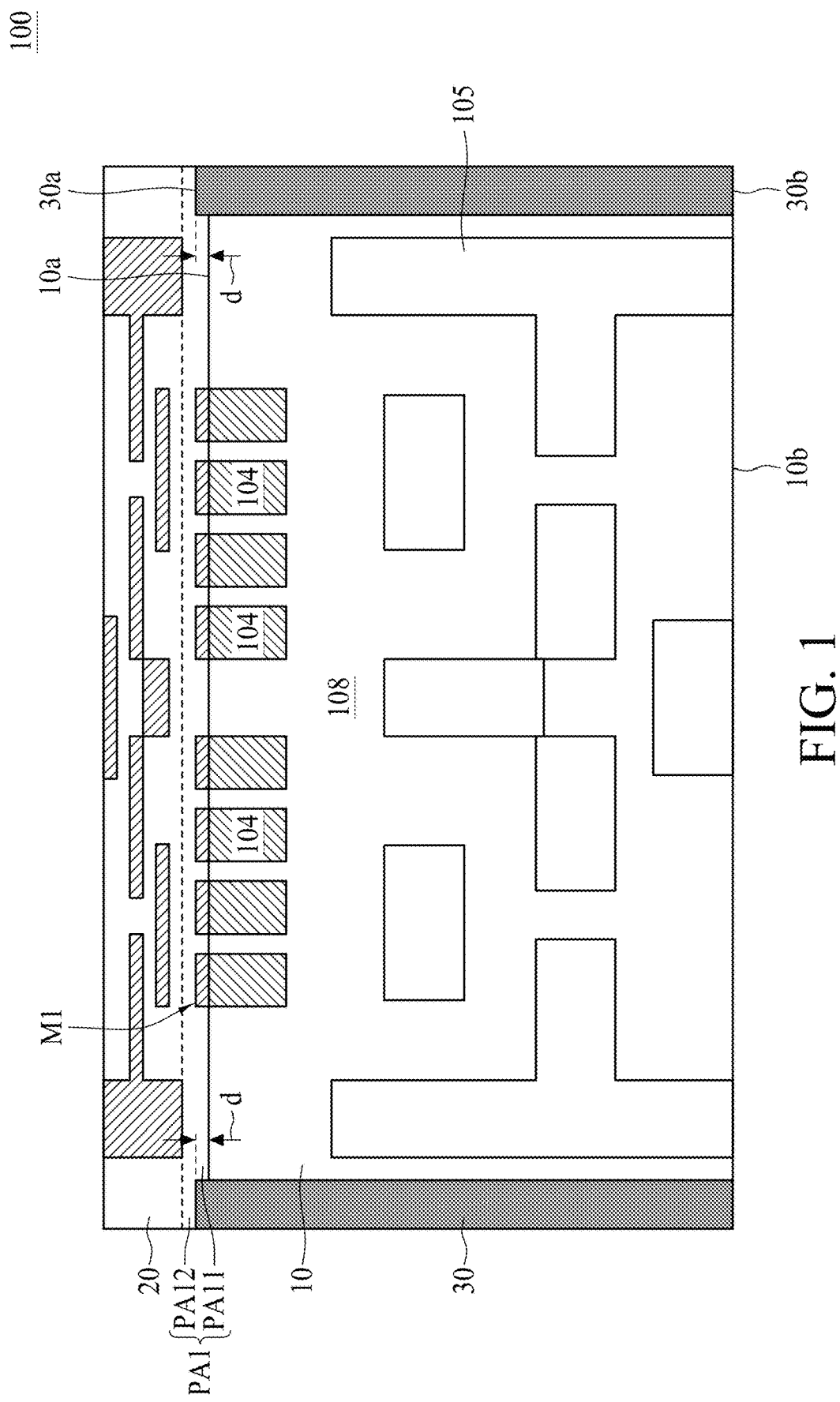
FIG. 1 is a cross-sectional view of a substrate structure in accordance with an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some comparative approaches, a redistribution structure, which may include dielectric layers and conductive layers in the dielectric layers, is held by a carrier before attached to a substrate. The redistribution structure may be attached to a substrate by an adhesive layer. Subsequently, the carrier together with the redistribution structure is cut in a sawing process. The carrier is then removed in a debonding process, exposing the sawn redistribution structure, which facilitates single dies to be formed thereon. A drilling process followed by, for example, an electroplating process is conducted to form conductive vias in the redistribution structure for electrical connection with the substrate. Such vias, due to the nature of a drilling process, may have a relatively large diameter. As a result, the number of vias is restricted, given a constrained space of a substrate available for forming vias.

Alternatively, the redistribution structure may be attached to a substrate by way of flip-chip bonding. In that case, an underfill may be applied between the redistribution structure and the substrate. Without the underfill, the redistribution structure may run the risk of die crack or bump damage during a subsequent debonding process. An underfill may thus be included. The redistribution structure may be thinner than approximately forty (40) micrometers (μm). As a result, when an underfill is applied after the flip-chip bonding process, the underfill may be liable to an overflow beyond a side boundary between the redistribution structure and the underfill, incurring a clamping issue. The clamping causes the carrier difficult to debond from the redistribution structure.

After the redistribution structure is attached to the substrate, either by adhesive layer or flip-chip bonding as above discussed or by others, the carrier is removed after a sawing process. Consequently, the carrier is consumed and may then be discarded. It is unfortunate that the carrier, which generally is made of a relatively expensive material, becomes non-recyclable after use.

It may therefore be desirable to provide a substrate structure and a method of manufacturing a substrate structure that can address the drilling and clamping issues, and realize recycling of a carrier.

FIG. 1 is a cross-sectional view of a substrate structure 100 in accordance with an embodiment of the present disclosure.

Referring to FIG. 1, the substrate structure 100 includes a substrate 10 and a redistribution structure 20 on the substrate 10. The substrate 10, having a first surface 10a and a second surface 10b opposite to the first surface 10a, includes contact pads 104 arranged at the first surface 10a. Moreover, the substrate 10 in the present embodiment is free from solder mask on the first surface 10a. Also, the substrate 10 includes dielectric layers 108, and a wiring structure 105 in the dielectric layers 108 for electrical communication between the contact pads 104 at the first surface 10a and electrical conductors (not shown) at the second surface 10b.

The substrate 10 is surrounded by an encapsulating layer 30. The encapsulating layer 30 has a first surface 30a and a second surface 30b opposite to the first surface 30a. A gap "d" exists between the first surface 10a of the substrate 10 and the first surface 30a of the encapsulating layer 30. For convenience, the gap "d" represents a difference in elevation between the first surfaces 10a and 30a, and a space defined therebetween as well. Suitable materials for the encapsulating layer 30 may include molding compound such as epoxy molding compound (EMC). In addition, the encapsulating layer 30 may include fillers (not shown) to improve properties such as moisture absorption, coefficient of thermal expansion and mechanical strength. During manufacturing the substrate structure 100, the encapsulating layer 30 has been subjected to a grinding process on the first surface 30a, while the substrate 10 is free from such grinding process. Broken fillers in the encapsulating layer 30 resulting from the grinding process are likely to worsen the surface roughness of the first surface 30a of the encapsulating layer 30. In an embodiment, surface roughness of the first surface 30a of the encapsulating layer 30 ranges from approximately 0.1 μm to approximately 0.9 μm. By comparison, surface roughness of the first surface 10a of the substrate 10, which is free from the grinding process, ranges from approximately 0.01 μm to approximately 0.09 μm. Accordingly, the first surface 10a of the substrate 10 is significantly smaller in surface roughness than the first surface 30a of the reduced encapsulating layer 30.

The redistribution structure 20 is disposed on the first surface 10a of the substrate 10 and the first surface 30a of the encapsulating layer 30. The redistribution structure 20 includes dielectric layers and conductive layers in the dielectric layers. For example, the redistribution structure 20 may include five (5) dielectric layers and 6 conductive layers, thereby constituting a "5P6M" configuration. For simplicity, a representative first conductive layer M1 and a representative first dielectric layer PA1 are labeled. In particular, the first conductive layer M1 of the redistribution structure 20 is disposed in the gap "d" on the first surface 10a of the substrate 10. The first conductive layer M1 includes conductive pads corresponding in position to the contact pads 104 at the first surface 10a for electrical connection between the redistribution structure 20 and the substrate 10. In addition, the first dielectric layer PA1 of the redistribution structure 20 is disposed on the first surface 10a of the substrate 10 and the first surface 30a of the encapsulating layer 30, filling the gap "d" and covering the first conductive layer M1. The first dielectric layer PA1 includes a first portion PA11 disposed on the first surface 10a of the substrate 10 and a second portion PA12 disposed on the first surface 30a of the encapsulating layer 30 and on the first portion PA11. The first portion PA11 has a thickness substantially equal to the gap.

In the substrate structure 100, the gap "d" facilitates the redistribution structure 20, in particular the first dielectric layer PA1, to adhere to the substrate 10 and the encapsulating layer 30. Enhanced adhesion between the redistribution structure 20 and the substrate 10 and the encapsulating layer 30 avoids delamination of the redistribution structure 20. Moreover, since the substrate 10 is surrounded by the encapsulating layer 30, adhesion among the redistribution structure 20, the substrate 10 and the encapsulating layer 30 is enhanced. Furthermore, since the first surface 10a of the substrate 10 is free from solder mask, adhesion between the redistribution structure 20 and the substrate 10 is enhanced.

Figure 2:
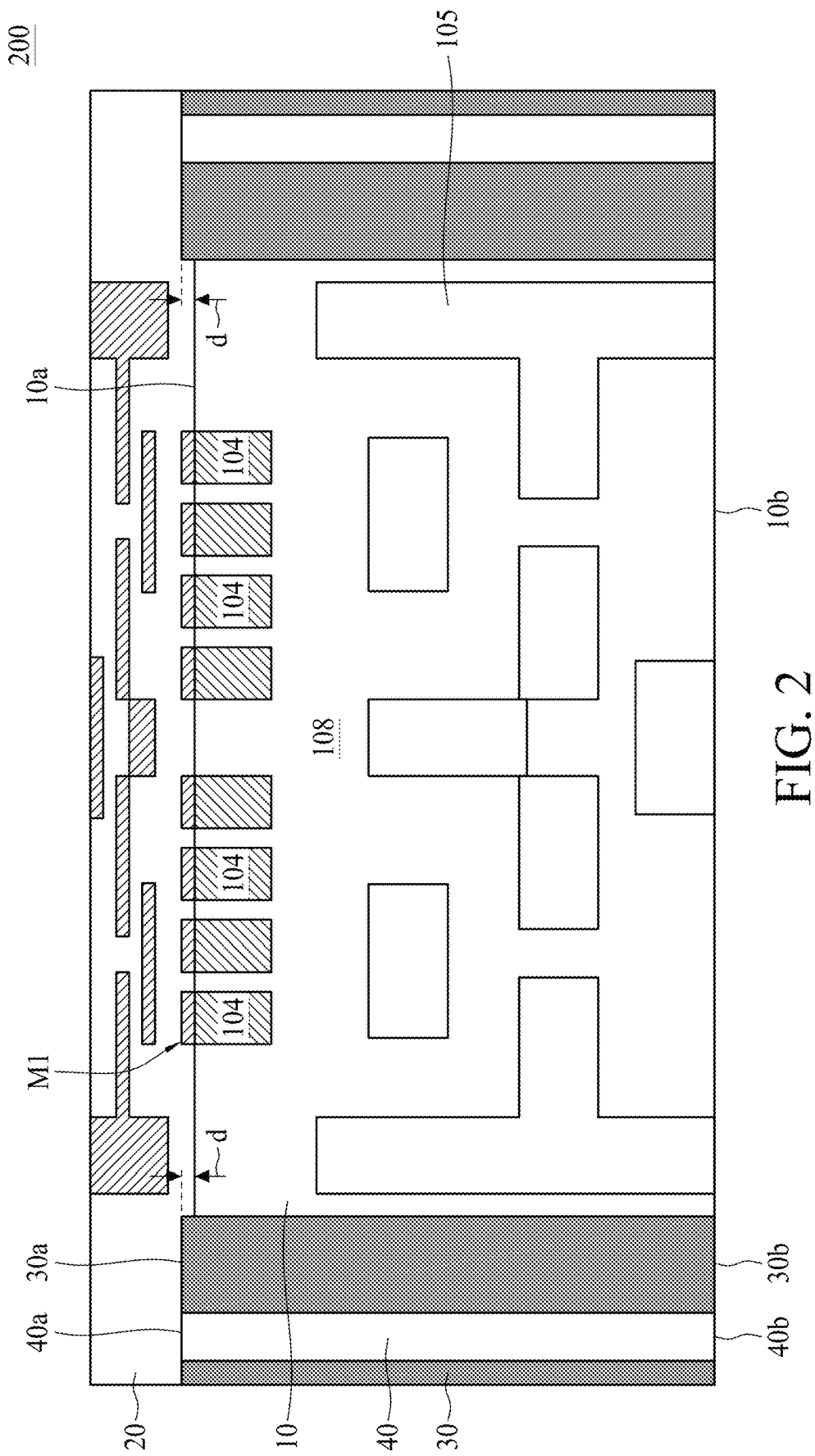
FIG. 2 is a cross-sectional view of a substrate structure in accordance with another embodiment of the present disclosure.

FIG. 2 is a cross-sectional view of a substrate structure 200 in accordance with another embodiment of the present disclosure.

Referring to FIG. 2, the substrate structure 200 is similar to the substrate structure 100 described and illustrated with reference to FIG. 1 except, for example, further including a support ring 40. The support ring 40, having a first surface 40a and a second surface 40b opposite to the first surface 40a, functions to strengthen the substrate structure 200. In an embodiment, the support ring 40 includes a thermally conductive material and thus facilitates heat dissipation for the substrate structure 200. The support ring 40 is substantially sealed in the encapsulating layer 30, and surrounds the substrate 10. In addition, the first surface 40a of the support ring 40 may be level with the first surface 30a of the encapsulating layer 30. Moreover, the second surface 40b of the support ring 40 is substantially level with the second surface 10b of the substrate 10 and the second surface 30b of the encapsulating layer 30.

Since the substrate 10 is surrounded by the support ring 40, which in turn is sealed in and surrounded by the encapsulating layer 30, the mechanical strength or rigidity of the substrate structure 200 is enhanced.

Figure 3:
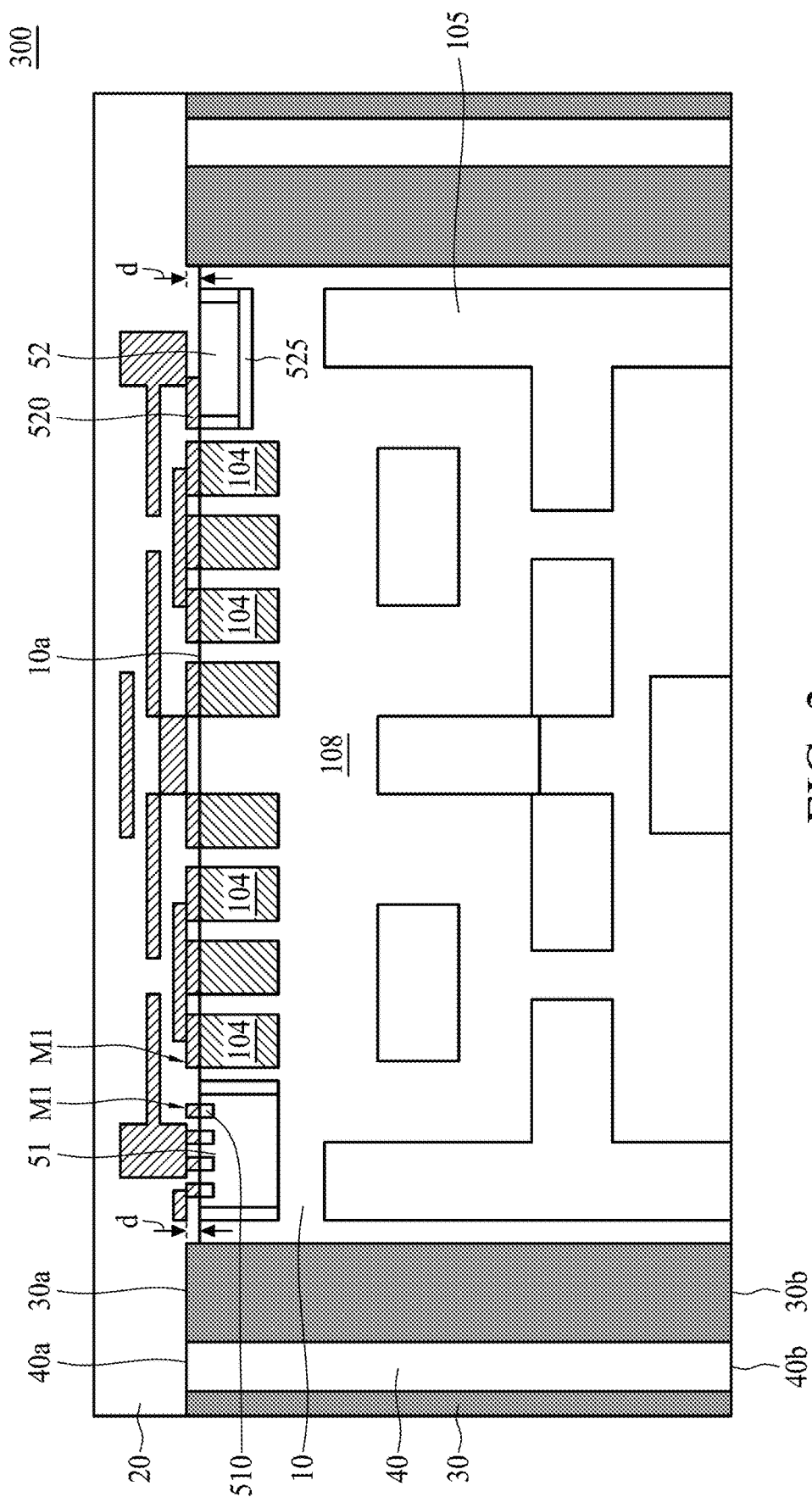
FIG. 3 is a cross-sectional view of a substrate structure in accordance with yet another embodiment of the present disclosure.

FIG. 3 is a cross-sectional view of a substrate structure 300 in accordance with yet another embodiment of the present disclosure.

Referring to FIG. 3, the substrate structure 300 is similar to the substrate structure 200 described and illustrated with reference to FIG. 2 except, for example, further including one or more devices. Specifically, the substrate structure 300 includes a first device 51 and a second device 52 embedded in the first surface 10a. The embedded devices 51 and 52 enrich the functionality of the substrate structure 300. The first device 51 may be embedded at a first depth from the first surface 10a of the substrate 10, and the second device 52 may be embedded at a second depth from the first surface 10a of the substrate 10. The first depth may be different from the second depth. In the present embodiment, the first device 51 includes an active device, while the second device 52 includes a passive device. In other embodiments, each of the first device 51 and the second device 52 includes one of an active device or a passive device. The second device 52 is attached to the substrate 10 via an adhesive layer 525. Further, the first device 51 includes conductive pads 510, and the second device 52 includes electrodes 520. The conductive pads 510 may substantially be level with the contact pads 104, and electrically connected to corresponding conductive pads in the first conductive layer M1 of the redistribution structure 20. In addition, the electrodes 520 of the second device 52 are electrically connected to corresponding conductive pads in the first conductive layer M1 of the redistribution structure 20.

FIG. 4A through FIG. 4H illustrate one or more stages of a method of manufacturing a substrate structure 100 as illustrated in FIG. 1, in accordance with an embodiment of the present disclosure.

Figure 4A:
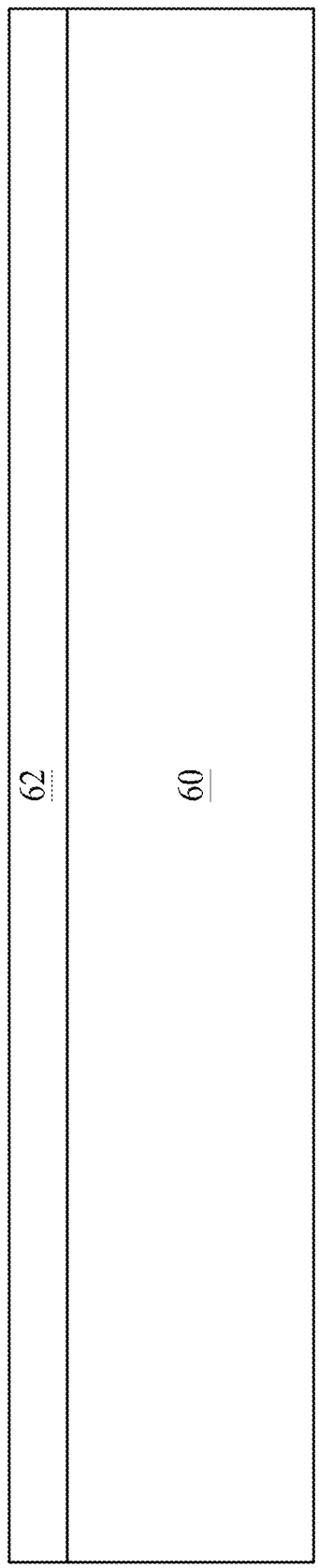
FIG. 4A, FIG. 4B, FIG. 4C, FIG. 4D, FIG. 4E, FIG. 4F, FIG. 4G, and FIG. 4H illustrate one or more stages of a method of manufacturing a substrate structure as illustrated in FIG. 1, in accordance with an embodiment of the present disclosure.

Referring to FIG. 4A, a carrier 60 is provided. The carrier 60 functions to support a substrate to be attached thereon. In addition, the carrier 60 also supports a redistribution structure to be formed on the substrate in a wafer level manufacturing process. In an embodiment, the carrier 60 includes a paper-based copper foil laminate, a composite copper foil laminate, or a polymer-impregnated glass-fiber-based copper foil laminate.

Subsequently, a release film 62 is formed on the carrier 60 in, for example, a coating process. The release film 62 functions to facilitate release of the carrier 60 from a substrate structure held by the carrier 60. In an embodiment, the release film 62 includes polymer and has a thickness of approximately 0.5 μm.

Figure 4B:
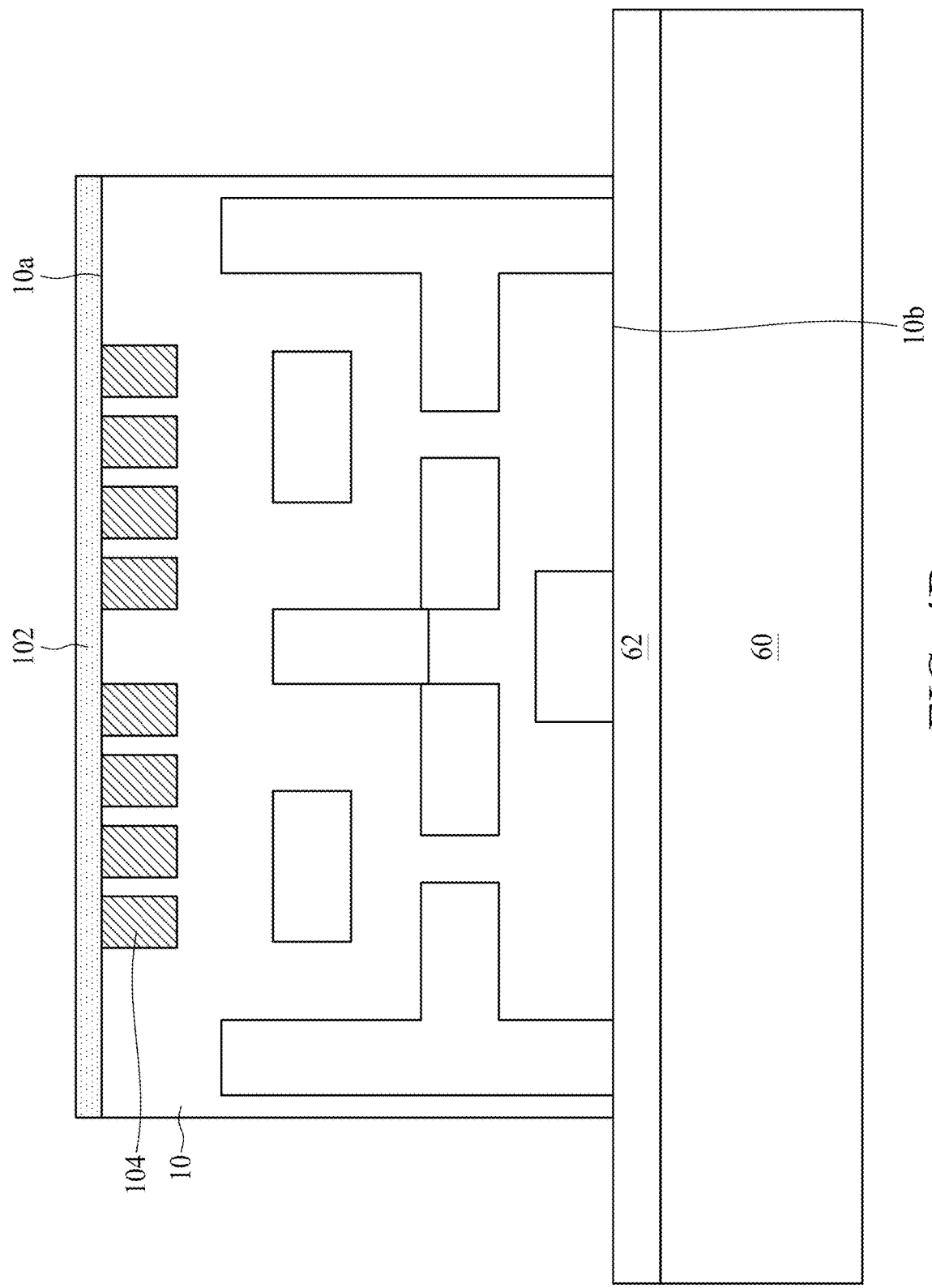

Referring to FIG. 4B, a substrate 10, having a first surface 10a and a second surface 10b opposite to the first surface 10a, is provided. The substrate 10 is attached at the second surface 10b to the release film 62. The substrate 10 includes a buffer layer 102 on the first surface 10a, and contact pads 104 arranged at the first surface 10a and connected to the buffer layer 102. In an embodiment, the substrate 10 has a thickness ranging from approximately 70 μm to approximately 1.7 millimeter (mm). Moreover, the buffer layer 102 may have a thickness ranging from approximately 0.5 μm to approximately 8 μm. Suitable materials for the buffer layer 102 include titanium (Ti) or titanium tungsten (TiW) alloy. In addition, the conductive pad 104 may include a seed layer and a conductive layer on the seed layer. The seed layer includes a first sub-layer of Ti or TiW and a second sub-layer of copper (Cu) on the first sub-layer, while the conductive layer includes a Cu layer. The first sub-layer, second sub-layer and the conductive layer have a thickness of approximately 0.3 μm, 0.2 μm and 5 μm, respectively.

The buffer layer 102 functions to enhance fabrication tolerance, and will be later removed. Materials of the buffer layer 102 and the contact pads 104 are selected to have significantly different selective ratios so that when the buffer layer 102 is removed, the contact pads 104 may substantially remain intact.

In some embodiments, the substrate 10 is provided with the buffer layer 102 and the conductive pads 104. Accordingly, the buffer layer 102 and the contact pads 104 are formed on the substrate 10 at separate fabrication processes. Alternatively, the substrate 10 is initially free from a buffer layer 102 and contact pads 104. After such substrate 10a is attached on the release film 62, contact pads 104 are formed at the first surface 10a of the substrate 10 by forming a seed layer in, for example, a sputtering process and then forming a conductive layer in, for example, an electroplating process. Afterwards, a buffer layer 102 is formed on the first surface 10a of the substrate 10 in, for example, a sputtering process.

Figure 4C:
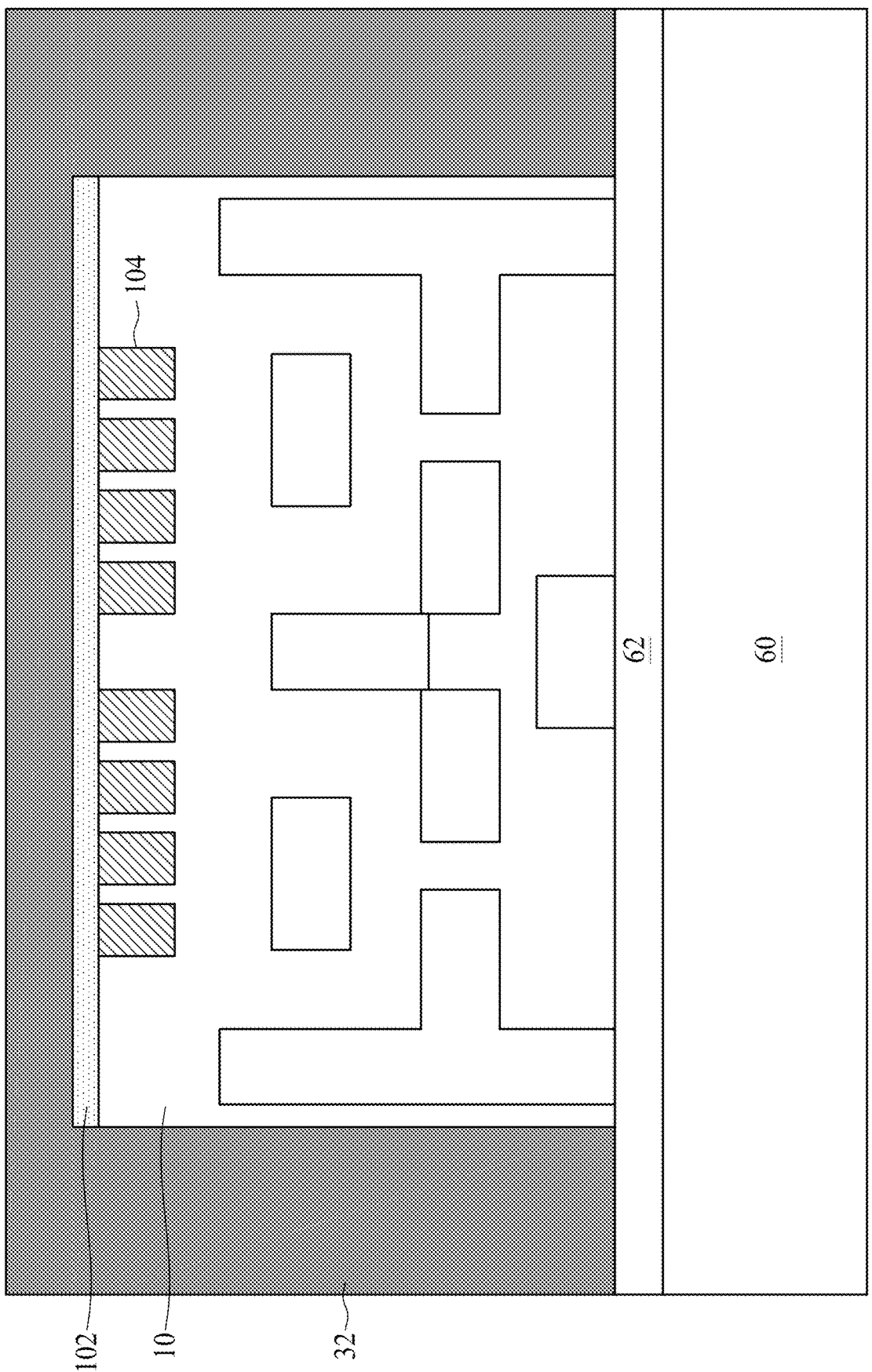

Referring to FIG. 4C, an encapsulating layer 32 is formed on the release film 62, covering the substrate 10. Suitable materials for the encapsulating layer 32 include molding compound such as epoxy molding compound (EMC). In addition, the encapsulating layer 32 may include fillers (not shown) to improve properties such as moisture absorption, coefficient of thermal expansion and mechanical strength.

Figure 4D:
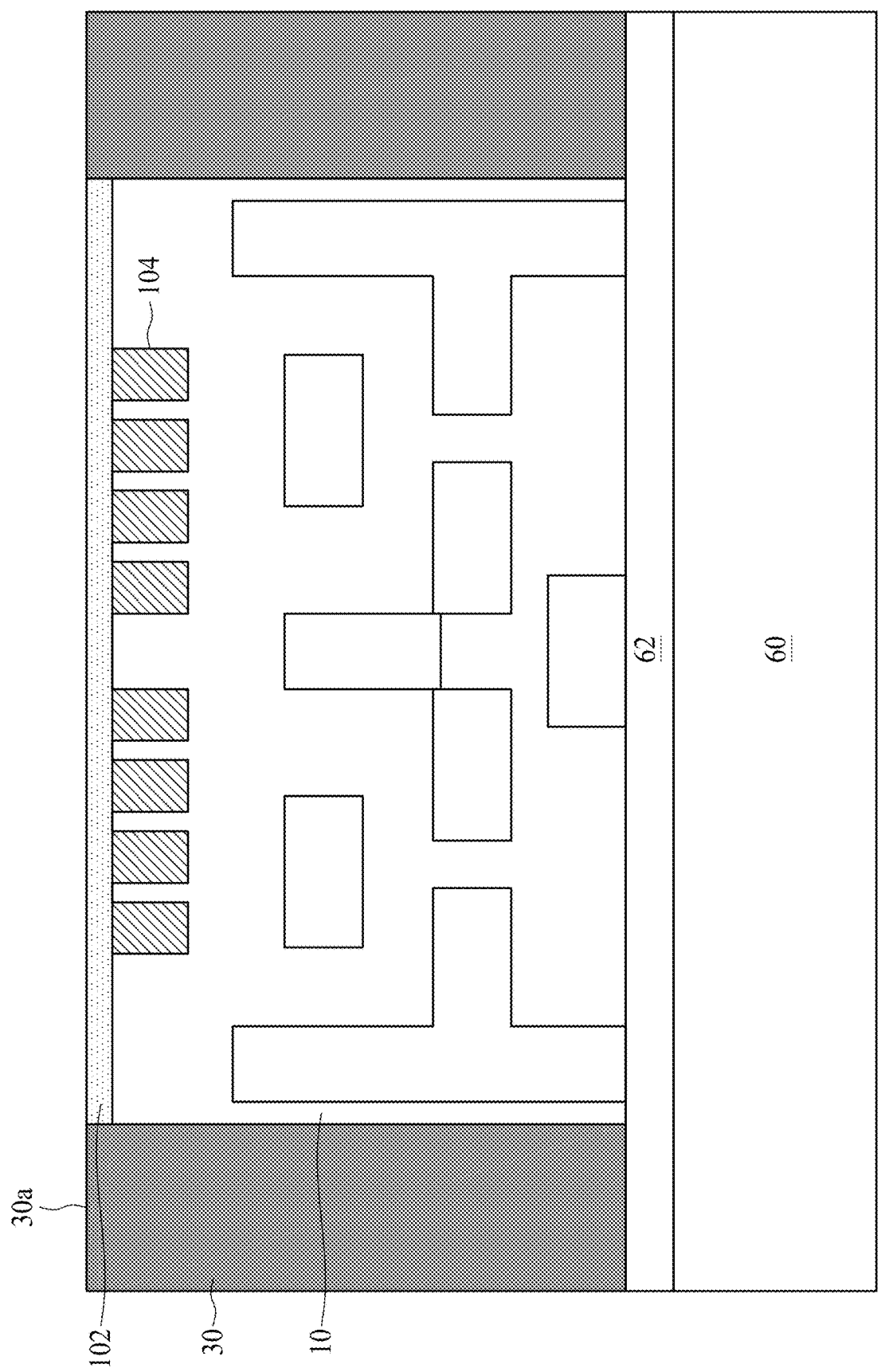

Referring to FIG. 4D, the encapsulating layer 32 is reduced in height in, for example, a grinding process, resulting in reduced encapsulating layer 30. The reduced encapsulating layer 30 exposes from a first surface 30a thereof the buffer layer 102. In addition, the reduced encapsulating layer 30 surrounds the substrate 10. The buffer layer 102 is substantially level with the first surface 30a of the reduced encapsulating layer 30.

Figure 4E:
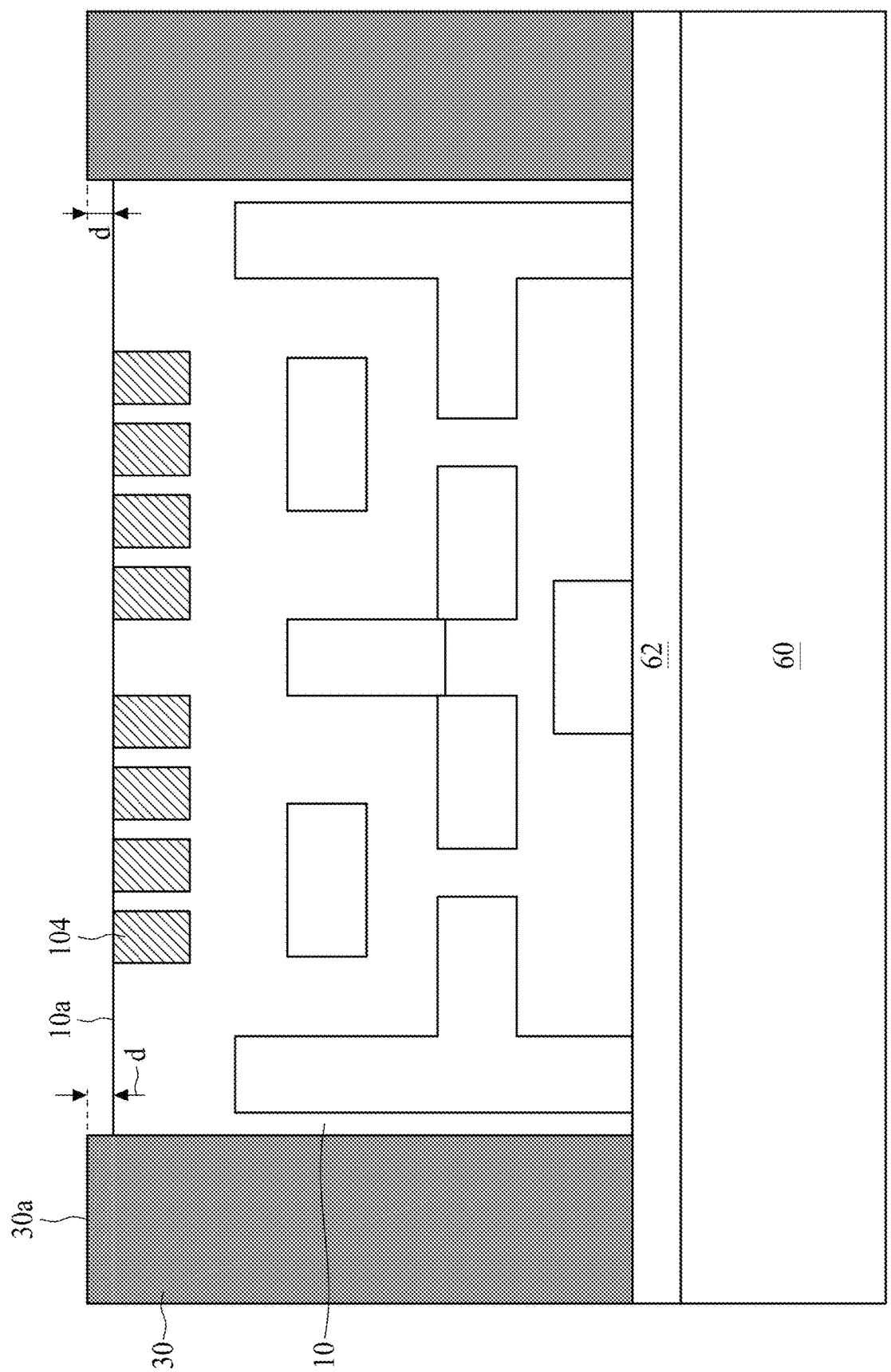

Next, referring to FIG. 4E, the buffer layer 102 is removed by, for example, an etching process such as a wet etching process, exposing the contact pads 104 at the first surface 10a of the substrate 10. Removal of the buffer layer 102 results in a gap "d" between the first surface 10a of the substrate 10 and the first surface 30a of the reduced encapsulating layer 30. As a result, the gap "d" substantially equals the thickness of the buffer layer 102. Furthermore, broken fillers in the reduced encapsulating layer 30 resulting from the grinding process are likely to worsen the surface roughness of the first surface 30a of the reduced encapsulating layer 30. In an embodiment, surface roughness of the first surface 30a of the reduced encapsulating layer 30 ranges from approximately 0.1 μm to approximately 0.9 μm. By comparison, surface roughness of the first surface 10a of the substrate 10, which is free from the grinding process, ranges from approximately 0.01 μm to approximately 0.09 μm. Accordingly, the first surface 10a of the substrate 10 is smaller in surface roughness than the first surface 30a of the reduced encapsulating layer 30.

Figure 4F:
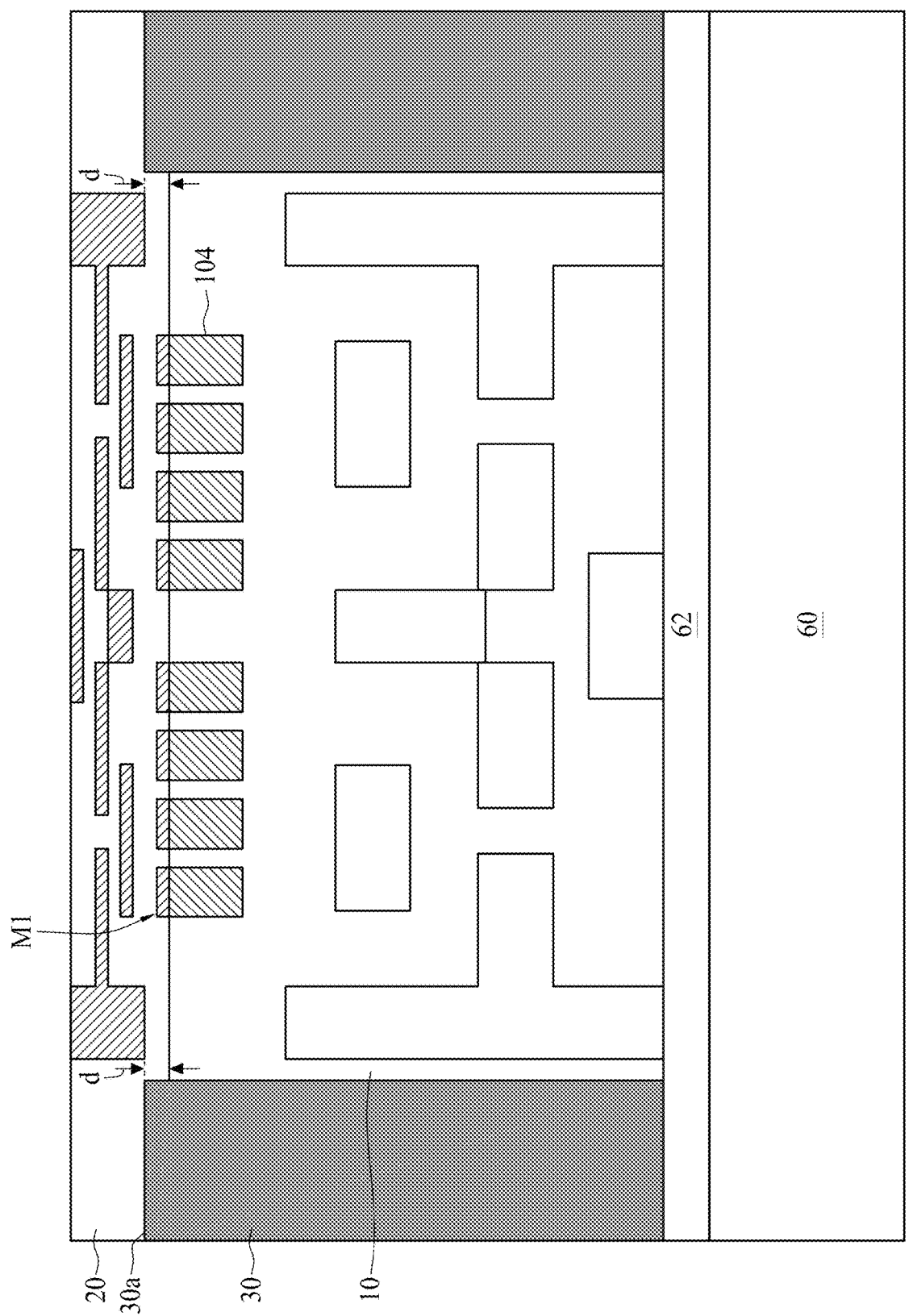

Referring to FIG. 4F, a redistribution structure 20 is formed on the first surface 30a of the reduced encapsulating layer 30, the contact pads 104 and the first surface 10a of the substrate 10. The redistribution structure 20 includes dielectric layers and conductive layers in the dielectric layers. Also referring to FIG. 1, in an embodiment, in the redistribution structure 20 a first dielectric layer PA1 fills the gap d, while a first conductive layer M1 is disposed on the first surface 10a of the substrate 10 in the gap d. After the redistribution structure 20 is formed, the carrier 60 together with the release film 62 is removed, as illustrated in FIG. 4G, in a debonding process.

Figure 4G:
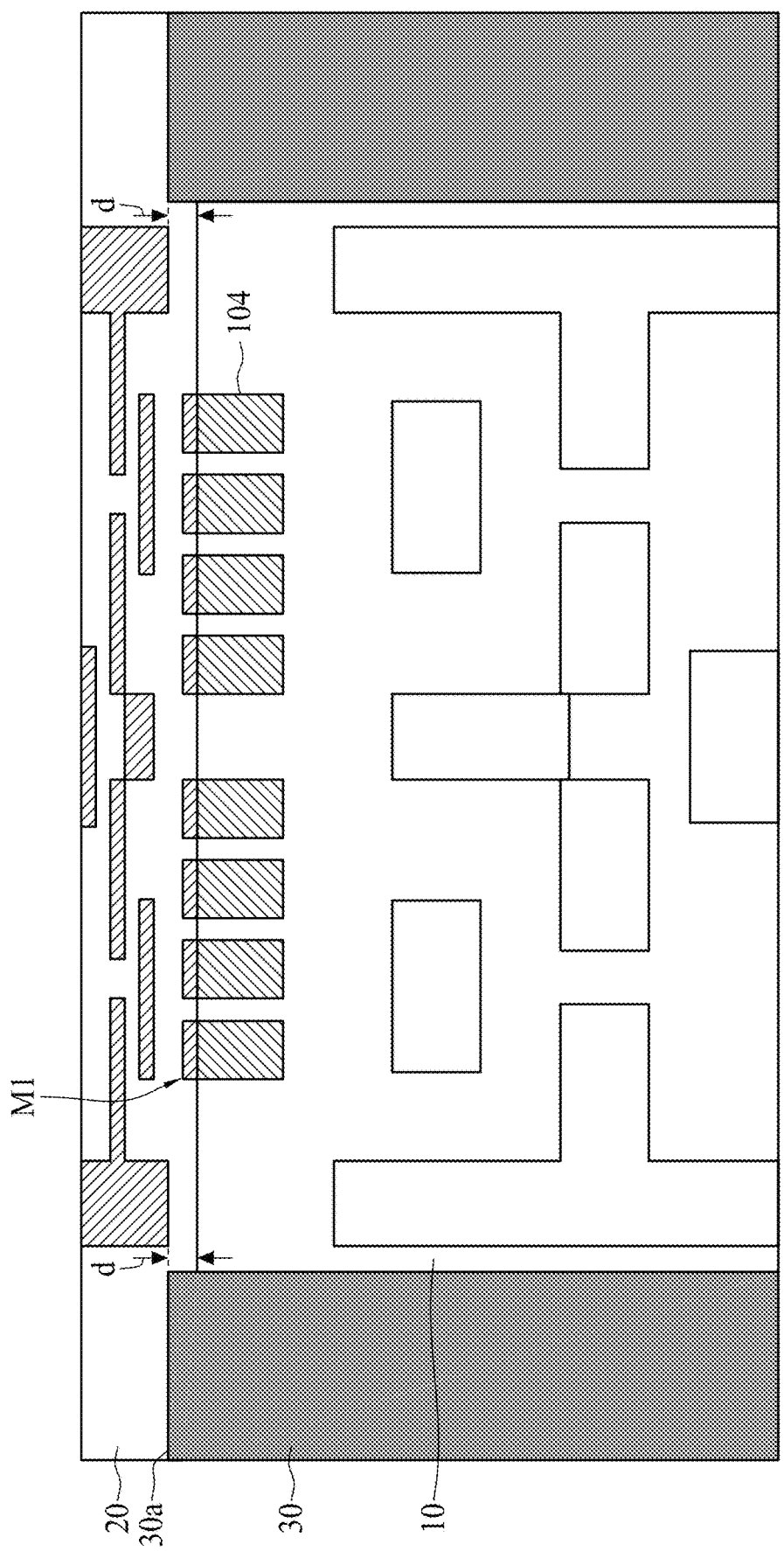
Figure 4H:
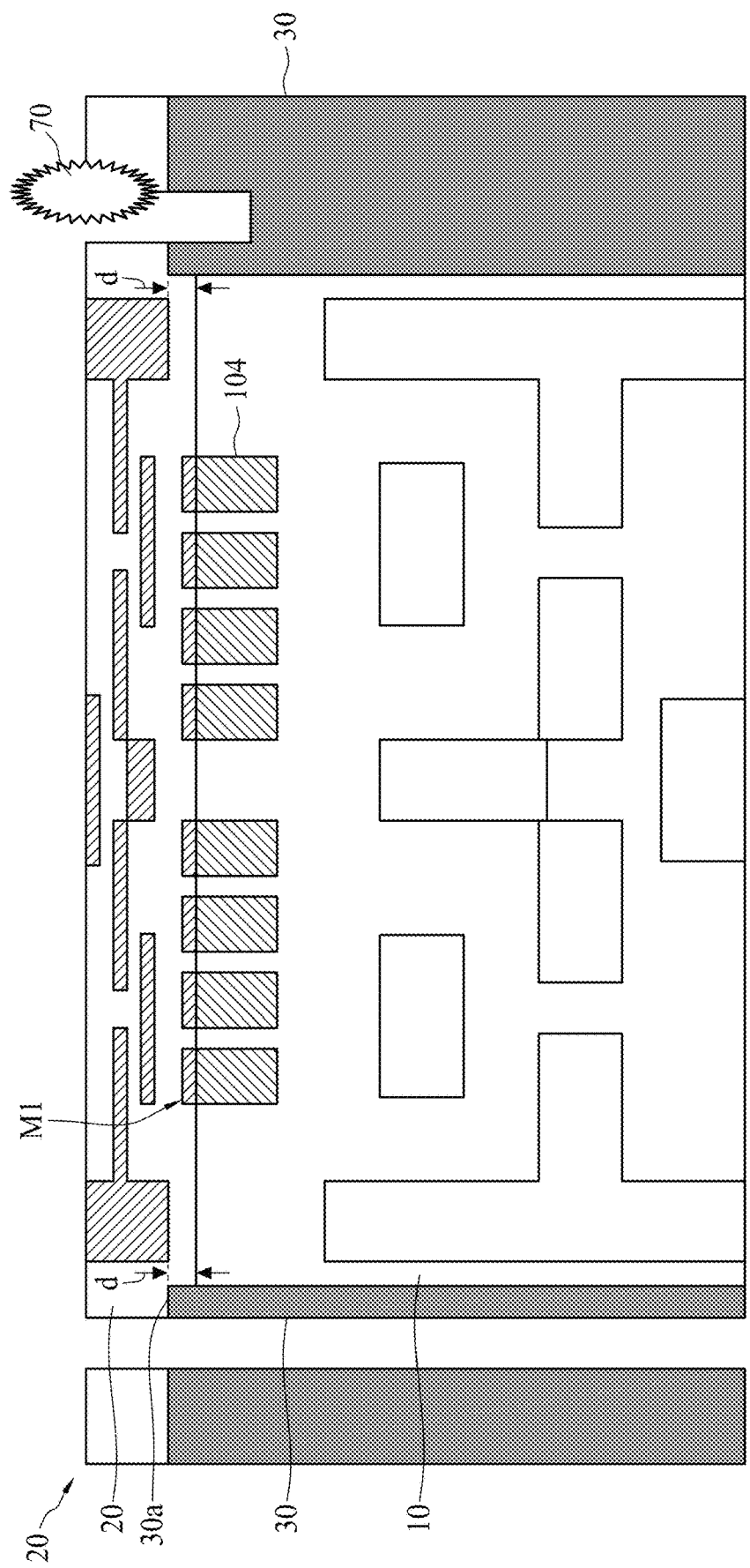

Referring now to FIG. 4H, a sawing process is then conducted on the resultant structure in FIG. 4G by using, for example, a sawing tool 70 along cutting lines on the redistribution structure 20. The sawing process removes portions of the redistribution structure 20 and the reduced encapsulating layer 30, resulting in a substrate structure 100 as described and illustrated with reference to FIG. 1. It is noted that the carrier 60 is removed prior to the sawing process. Unlike some comparative approaches, the carrier 60 is not sawn and thus is substantially kept intact. As a result, the carrier 60 is recyclable and thus is eco-friendly as well. Since a carrier for wafer-level manufacturing is relatively expensive, a recyclable carrier will no doubt offer a cost efficient manufacturing process.

In the exemplary manufacturing method as described and illustrated with reference to FIGS. 4A to 4H, no drilling process is employed. As a result, the problems of a relatively large via dimension and accordingly a constrained number of vias available, which would otherwise occur in some comparative approaches, are alleviated or solved. Moreover, a redistribution structure, instead of flip-chip bonding to a substrate as in the comparative approaches, is built on the substrate. As a result, no underfill is required to protect an interface between the substrate and the redistribution structure, and accordingly the problems of underfill clamping or difficult debonding are alleviated or solved. Furthermore, unlike the comparative approaches, a carrier used in the exemplary method is recyclable, which is eco-friendly and cost efficient.

FIG. 5A through FIG. 5F illustrate one or more stages of a method of manufacturing a substrate structure 200 as illustrated in FIG. 2, in accordance with an embodiment of the present disclosure.

Figure 5A:
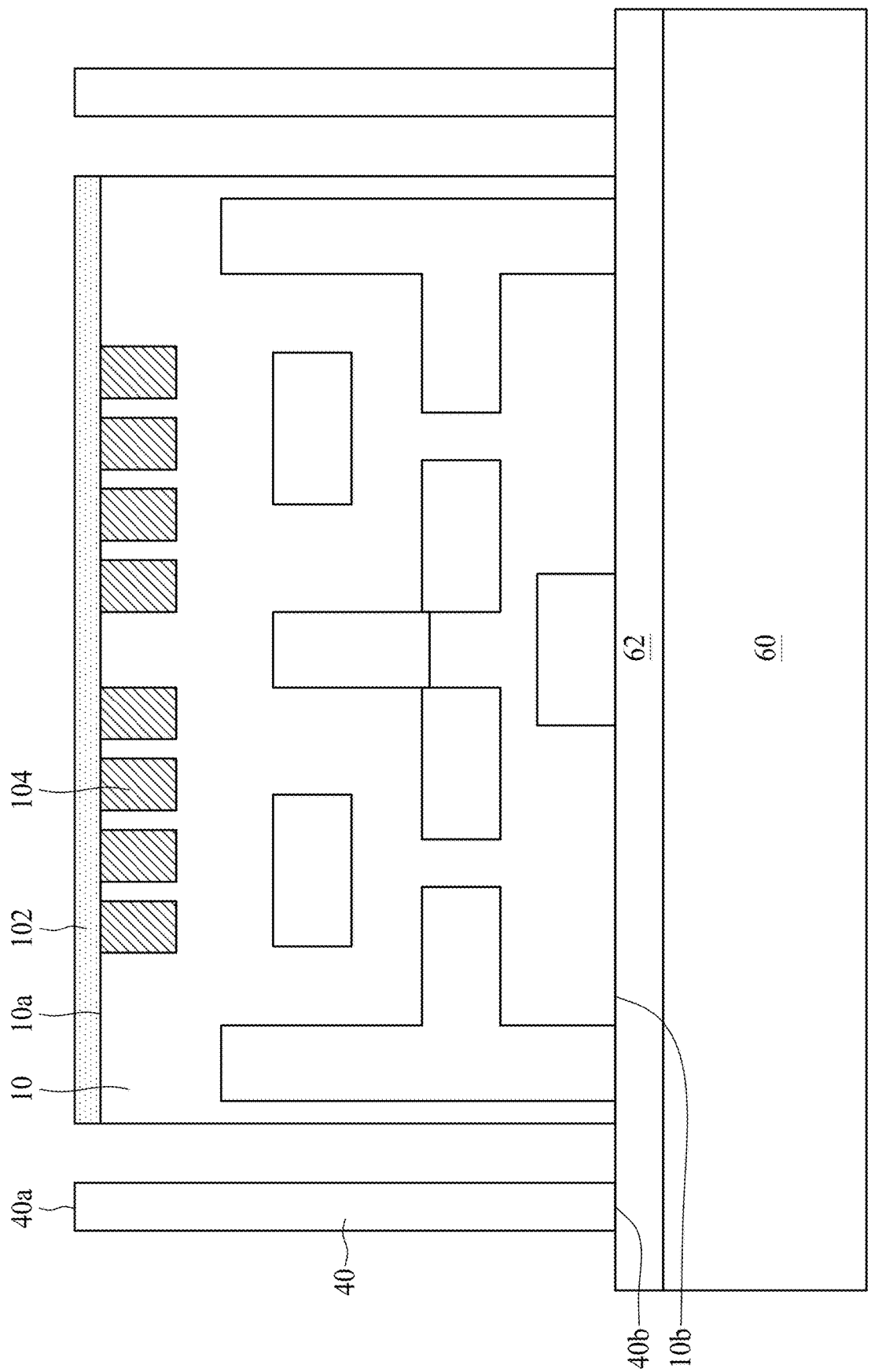
FIG. 5A, FIG. 5B, FIG. 5C, FIG. 5D, FIG. 5E, and FIG. 5F illustrate one or more stages of a method of manufacturing a substrate structure as illustrated in FIG. 2, in accordance with an embodiment of the present disclosure.

Referring to FIG. 5A, a carrier 60 is provided. A release film 62 is then formed on the carrier 60. Subsequently, a support ring 40, having a first surface 40a and a second surface 40b opposite to the first surface 40a, is provided. The support ring 40 is attached at the second surface 40b thereof on the release film 62. The support ring 40 functions to strengthen a substrate structure to be formed on the carrier 60. In an embodiment, the support ring 40 includes a thermally conductive material and thus facilitates heat dissipation for the substrate structure.

A substrate 10, having a first surface 10a and a second surface 10b opposite to the first surface 10a, is provided. The substrate 10 is attached at the second surface 10b thereof to the release film 62. The substrate 10 includes a buffer layer 102 on the first surface 10a, and contact pads 104 arranged at the first surface 10a and connected to the buffer layer 102. The substrate 10 is substantially surrounded by the support ring 40. In addition, the first surface 40a of the support ring 40 may optionally be level with the buffer layer 102, as in the present embodiment. The second surface 40b of the support ring 40 is substantially level with the second surface 10b of the substrate 10.

Figure 5B:
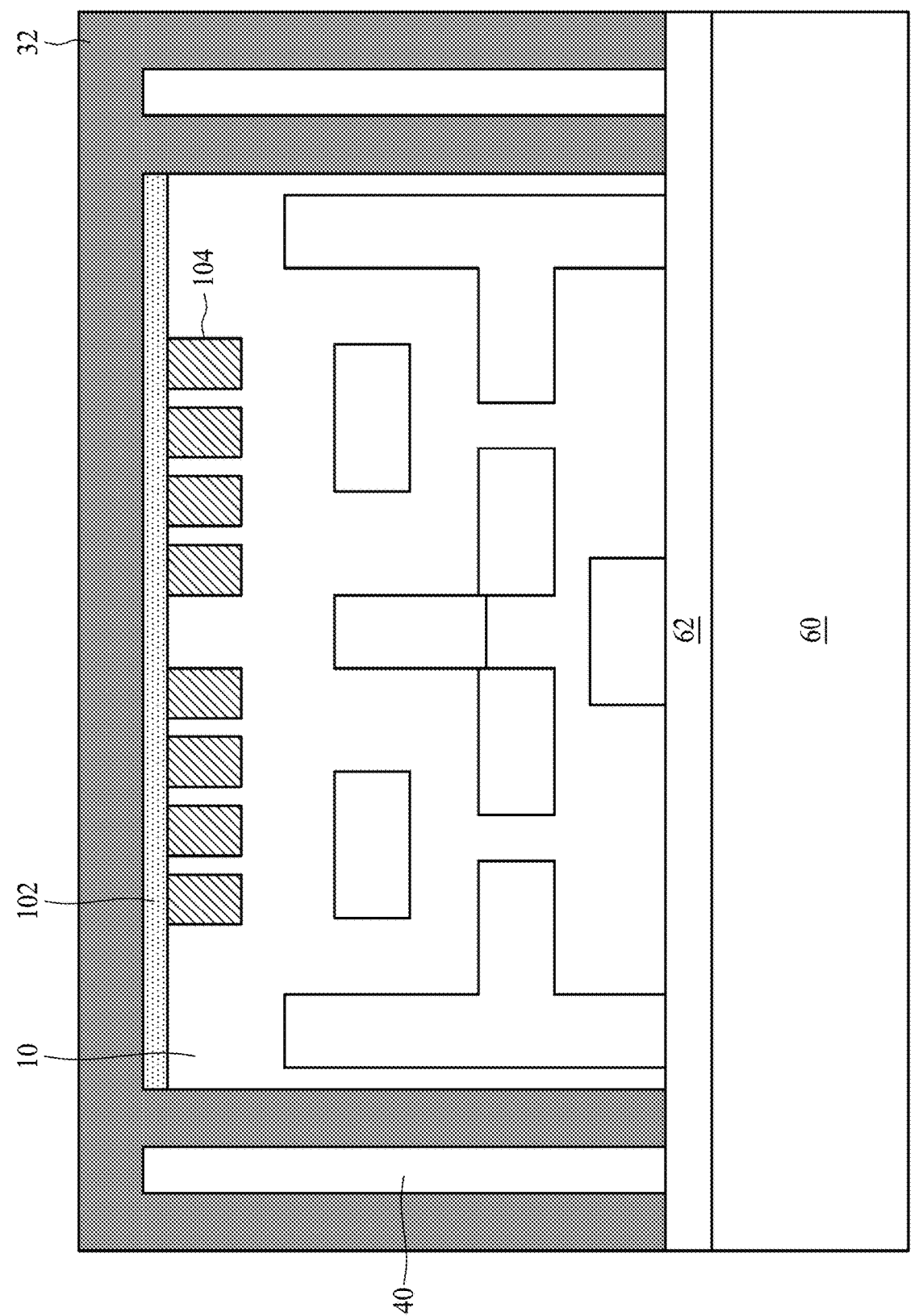

Referring to FIG. 5B, an encapsulating layer 32 is formed on the release film 62, covering the substrate 10 and the support ring 40.

Figure 5C:
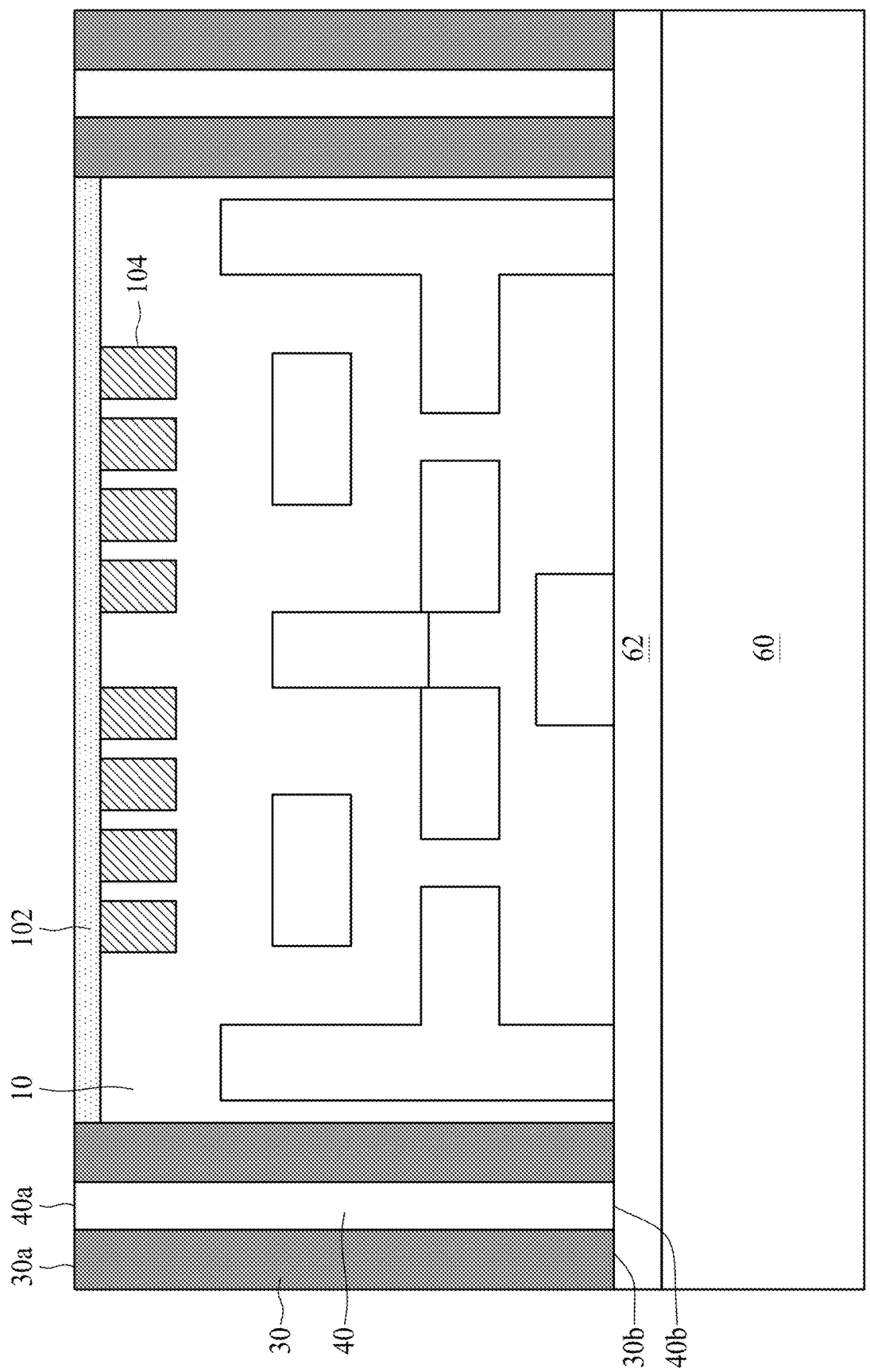

Referring to FIG. 5C, the encapsulating layer 32 is reduced in height in, for example, a grinding process, resulting in reduced encapsulating layer 30. The reduced encapsulating layer 30 exposes from a first surface 30a thereof the buffer layer 102. The buffer layer 102 is substantially level with the first surface 30a of the reduced encapsulating layer 30. In addition, the reduced encapsulating layer 30 may optionally expose the first surface 40a of the support ring 40. The second surface 40b of the support ring 40 is substantially level with a second surface 30b of the reduced encapsulating layer 30. In addition, the reduced encapsulating layer 30 surrounds the substrate 10.

Figure 5D:
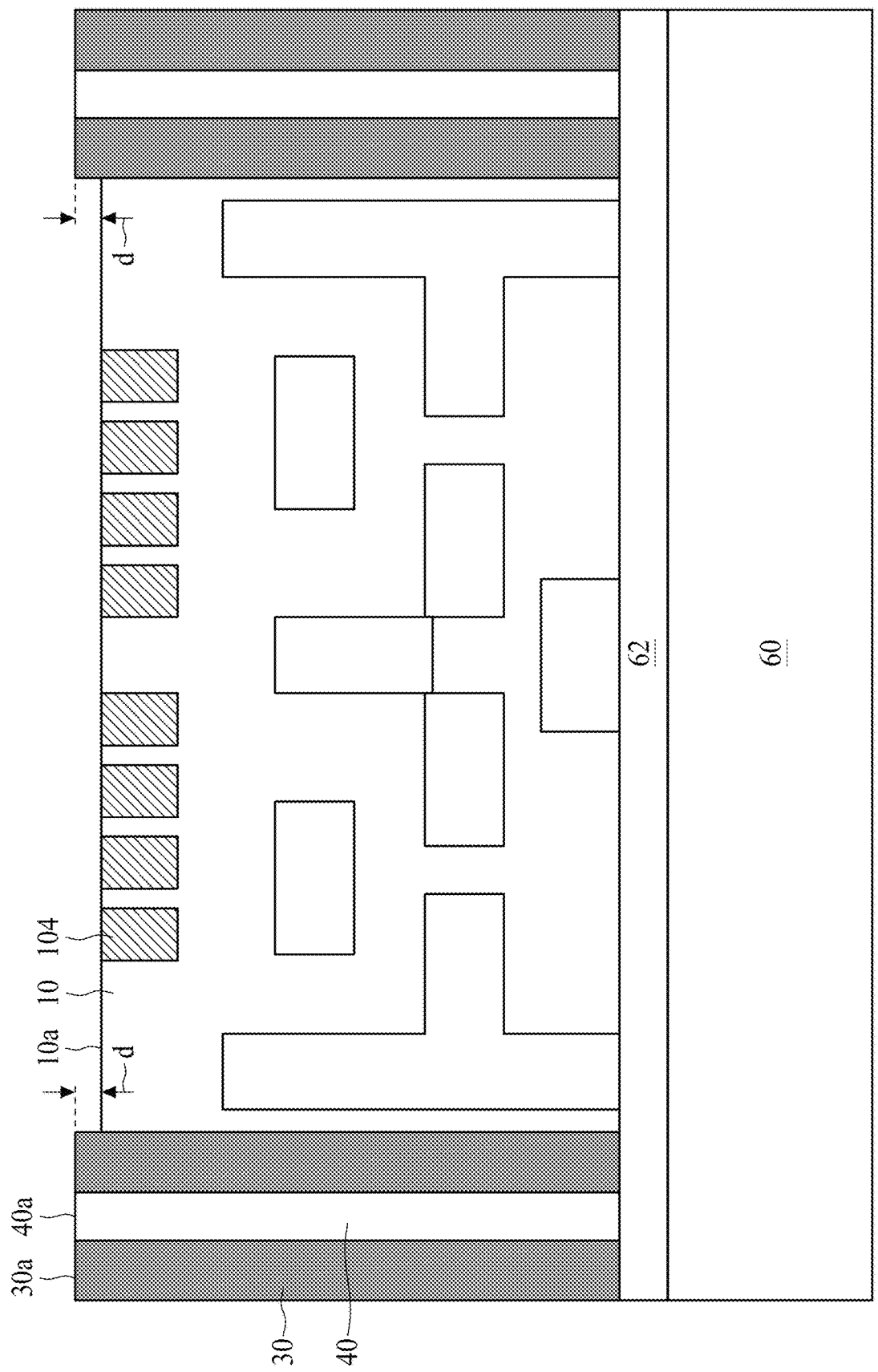

Next, referring to FIG. 5D, the buffer layer 102 is removed, exposing the contact pads 104 at the first surface 10a of the substrate 10. Removal of the buffer layer 102 results in a gap "d" between the first surface 10a of the substrate 10 and the first surface 30a of the reduced encapsulating layer 30. As a result, the gap "d" substantially equals the thickness of the buffer layer 102. Furthermore, as previously discussed, the first surface 10a of the substrate 10 is smaller in surface roughness than the first surface 30a of the reduced encapsulating layer 30.

Figure 5E:
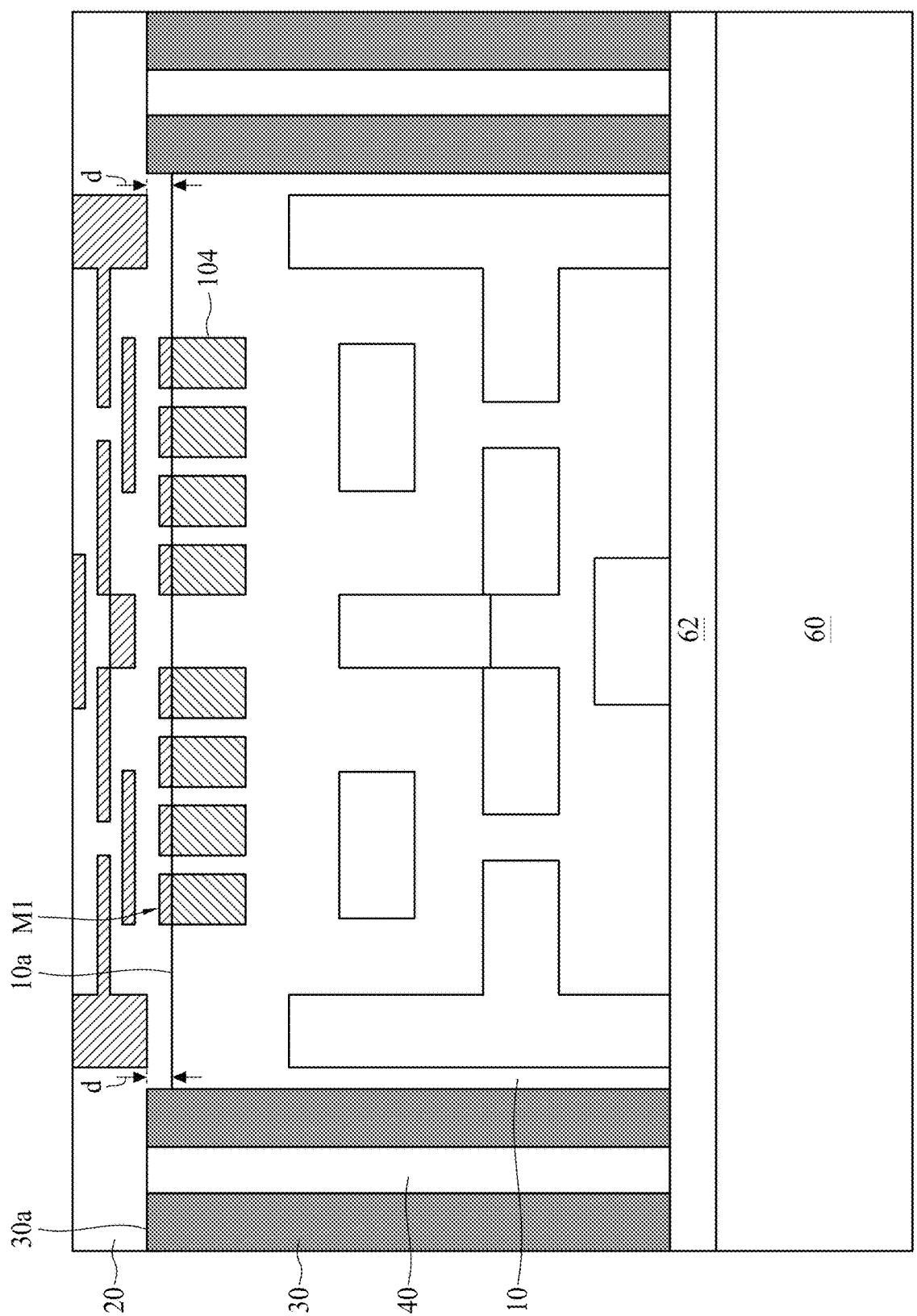
Figure 5F:
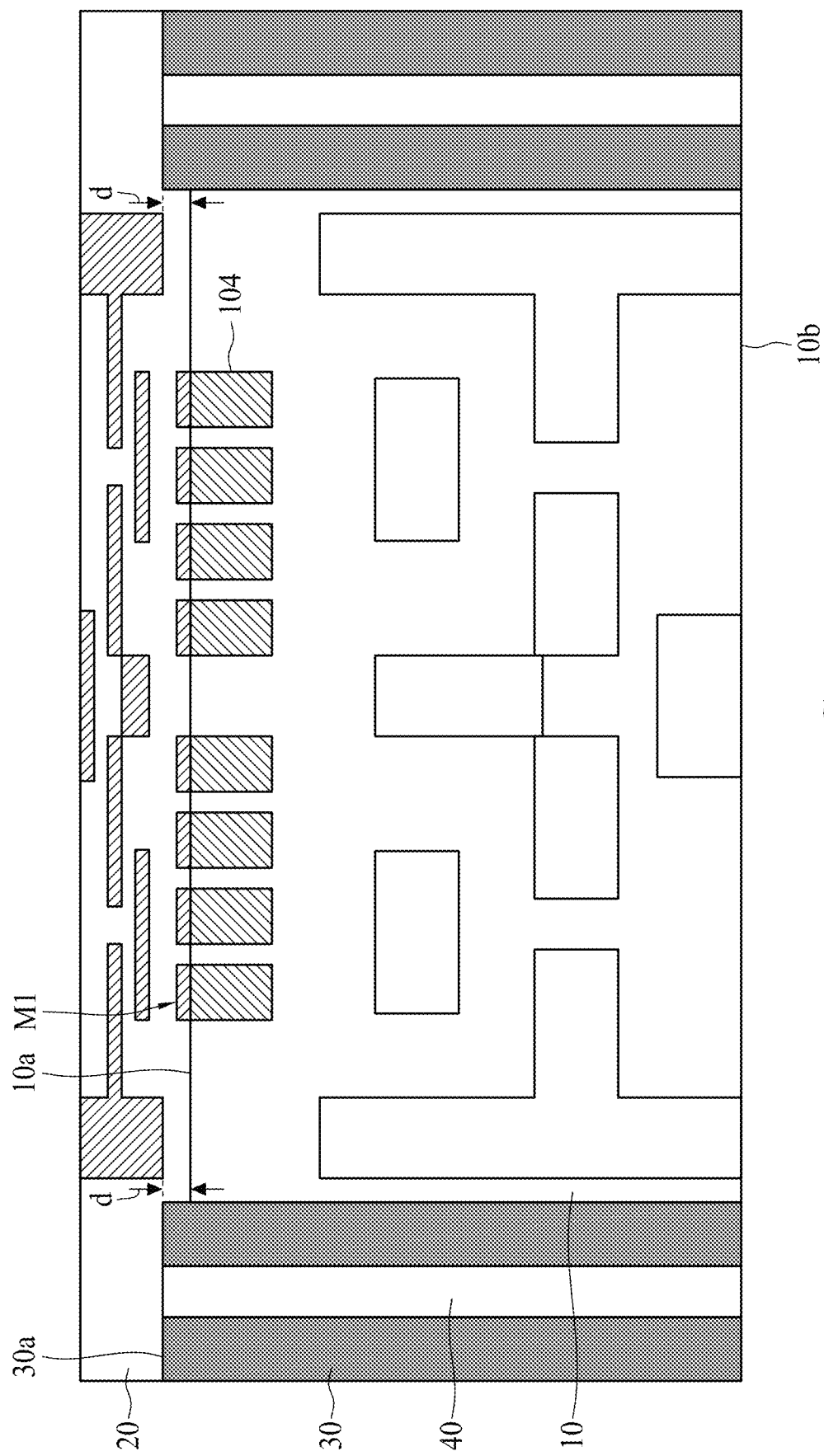

Referring to FIG. 5E, a redistribution structure 20 is formed on the first surface 30a of the reduced encapsulating layer 30, the contact pads 104 and the first surface 10a of the substrate 10. Also referring to FIG. 2, in an embodiment, in the redistribution structure 20 a first dielectric layer PA1 fills the gap d, while a first conductive layer M1 is disposed on the first surface 10a of the substrate 10 in the gap d. After the redistribution structure 20 is formed, the carrier 60 together with the release film 62 is removed, as illustrated in FIG. 5F, in a debonding process. Subsequently, a sawing process is conducted on the resultant structure in FIG. 5F along cutting lines on the redistribution structure 20. The sawing process removes portions of the redistribution structure 20 and the reduced encapsulating layer 30, resulting in a substrate structure 200 as described and illustrated with reference to FIG. 2.

Like the exemplary method in FIGS. 4A to 4H, the exemplary manufacturing method as described and illustrated with reference to FIGS. 5A to 5F alleviates or solves the issues or problems that would occur in the comparative approaches due to via drilling, underfill application or non-recyclable carrier. The exemplary method in FIGS. 5A to 5F thus also provides a reliable, eco-friendly and cost efficient manufacturing process.

FIG. 6A through FIG. 6J illustrate one or more stages of a method of manufacturing a substrate structure 300 as illustrated in FIG. 3, in accordance with an embodiment of the present disclosure.

Figure 6A:
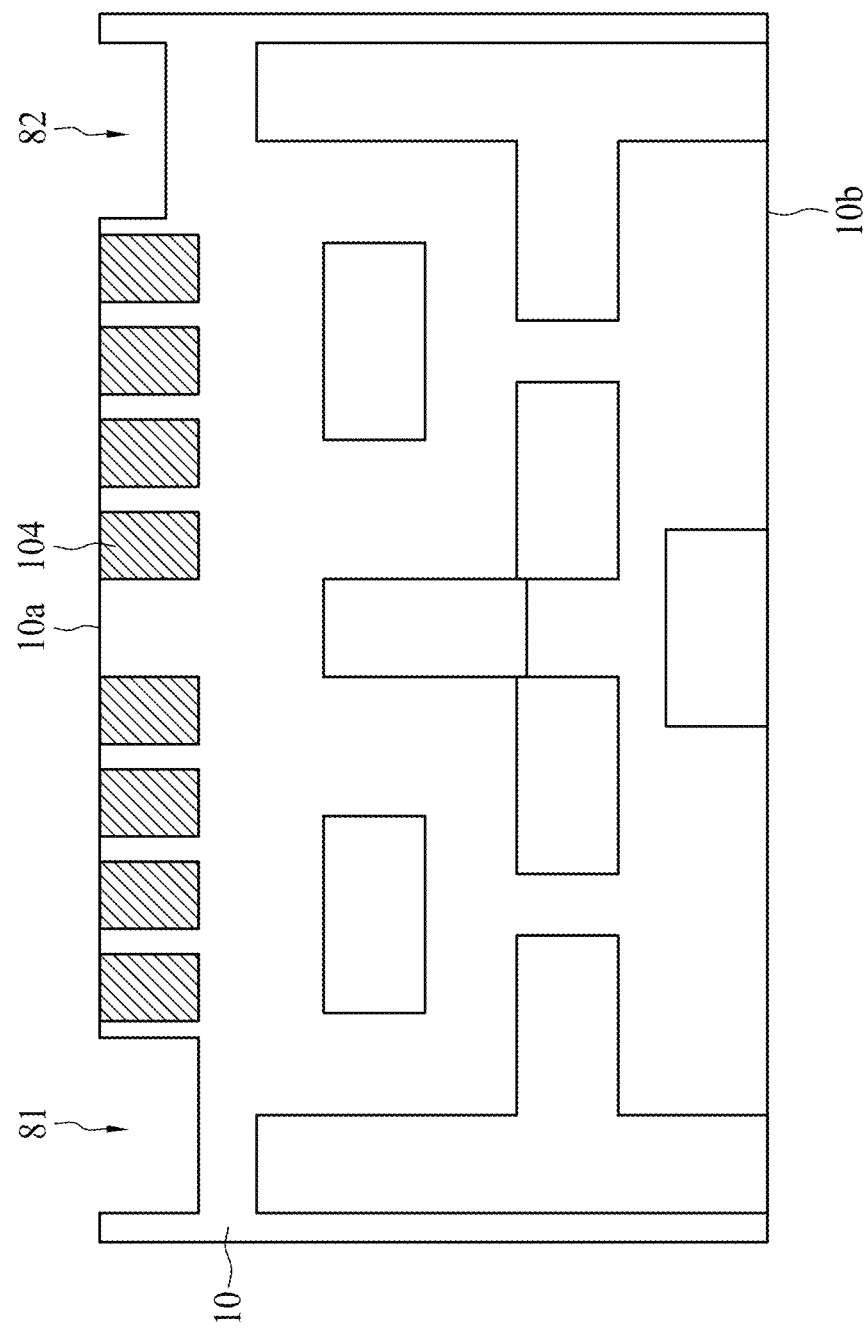
FIG. 6A, FIG. 6B, FIG. 6C, FIG. 6D, FIG. 6E, FIG. 6F, FIG. 6G, FIG. 6H, FIG. 6I, and FIG. 6J illustrate one or more stages of a method of manufacturing a substrate structure as illustrated in FIG. 3, in accordance with an embodiment of the present disclosure.

Referring to FIG. 6A, a substrate 10, having a first surface 10a and a second surface 10b opposite to the first surface 10a, is provided. The substrate 10 includes contact pads 104 arranged at the first surface 10a. In addition, the substrate 10 may include one or more recesses in the first surface 10a of the substrate 10. For example, in the present embodiment, the substrate 10 includes a first recess 81 and a second recess 82 in the first surface 10a. These recesses 81, 82 function to accommodate electronic devices, components or integrated chips. In an embodiment, the first recess 81 and the second recess 82 are different in depth.

Figure 6B:
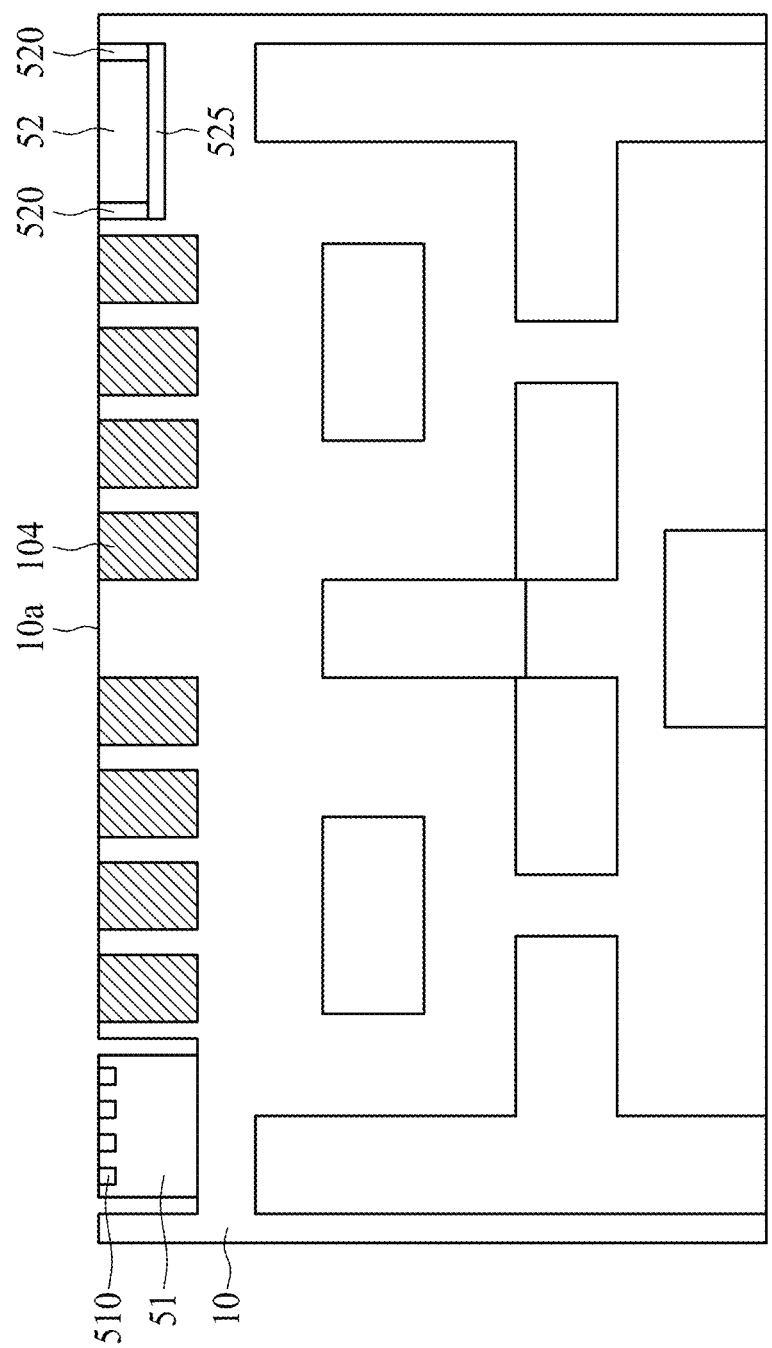

Referring to FIG. 6B, a first device 51 and a second device 52 are placed in the first recess 81 and the second recess 82, respectively. In an embodiment, the first device 51 includes an active device, while the second device 52 includes a passive device. Further, the first device 51 includes conductive pads 510, and the second device 52 includes electrodes 520. The conductive pads 510 may substantially be level with the contact pads 104.

Figure 6C:
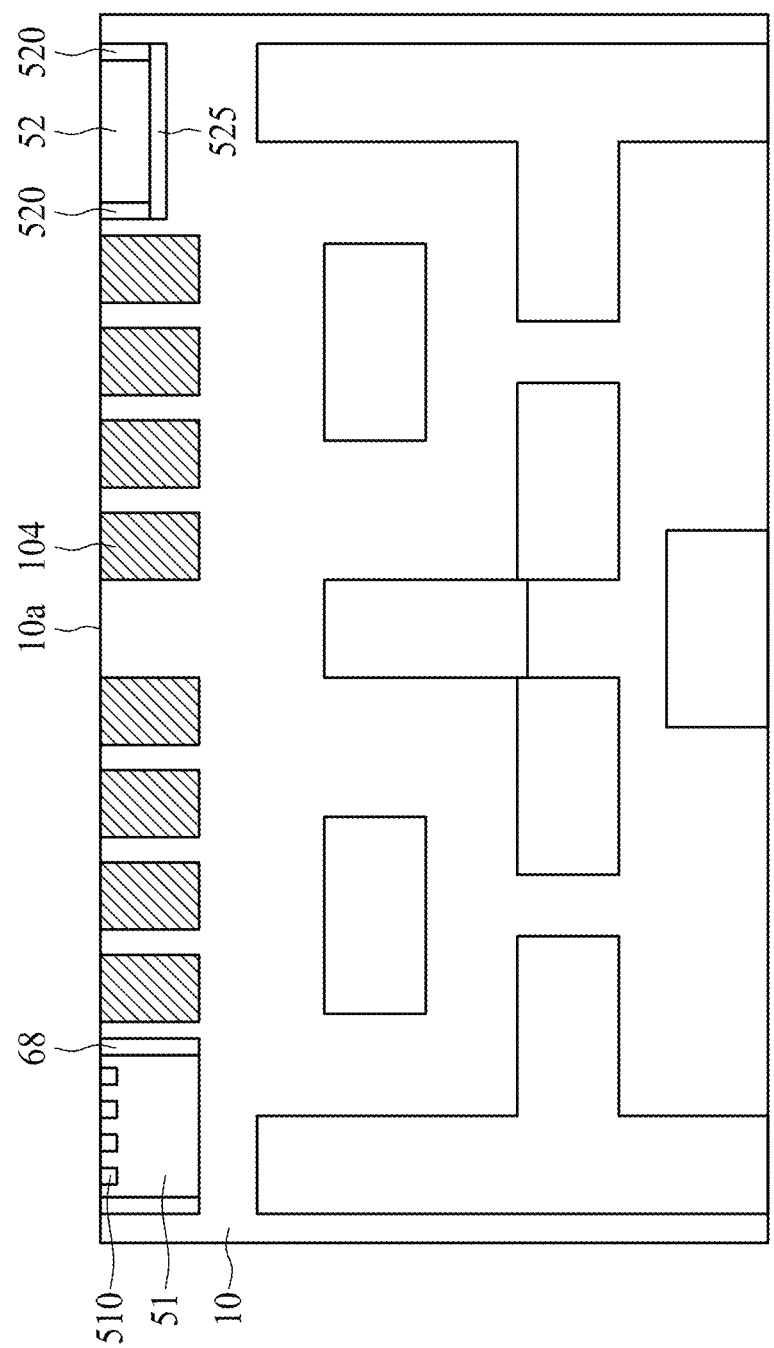

Referring to FIG. 6C, a dielectric layer 68 is formed, filling the first recess 81 and the second recess 82. The dielectric layer 68 exposes the conductive pads 510 of the first device 51 and the electrodes 520 of the second device 52.

Figure 6D:
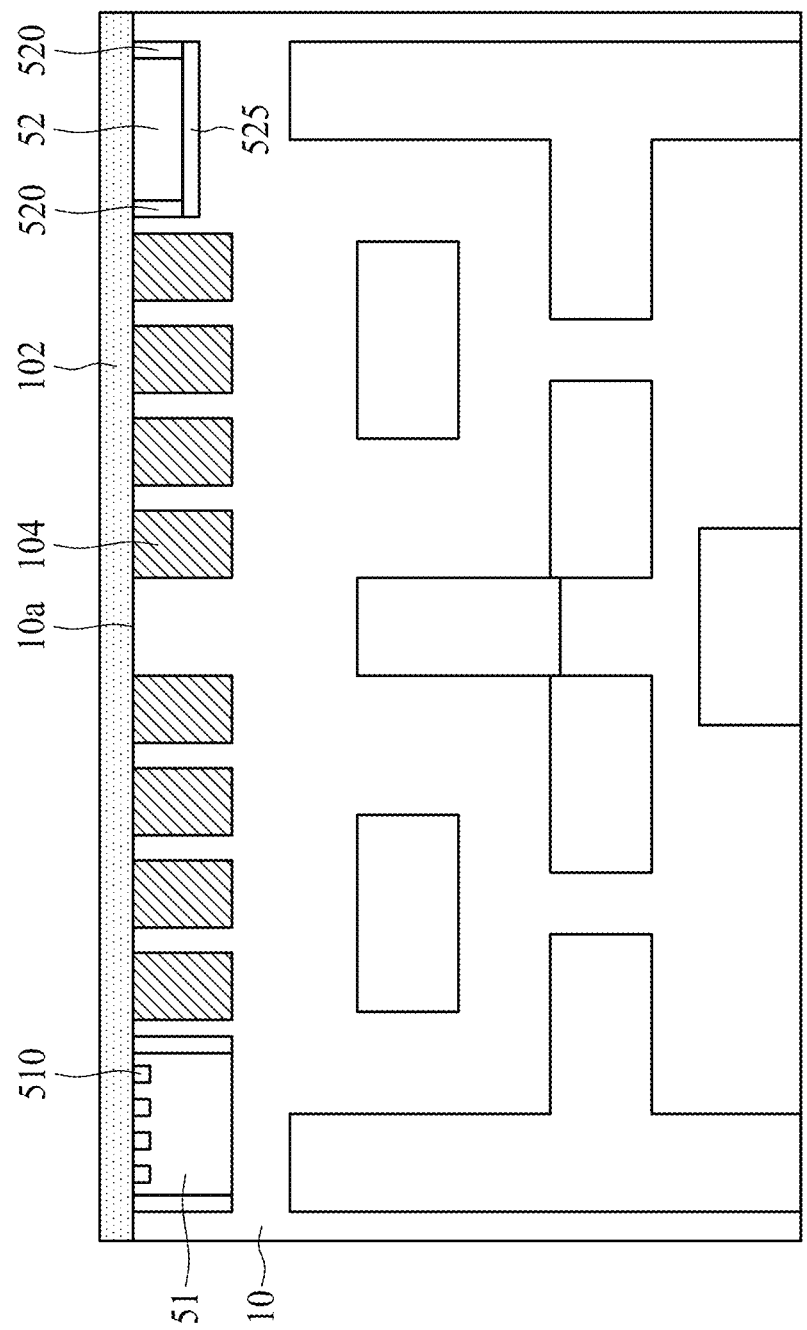

Next, referring to FIG. 6D, a buffer layer 102 is then formed on the first surface 10a of the substrate 10, covering the first device 51, the second device 52 and the contact pads 104. As a result, a substrate 10 provided with a buffer layer 102 and embedded first and second devices 51, 52 is achieved.

Figure 6E:
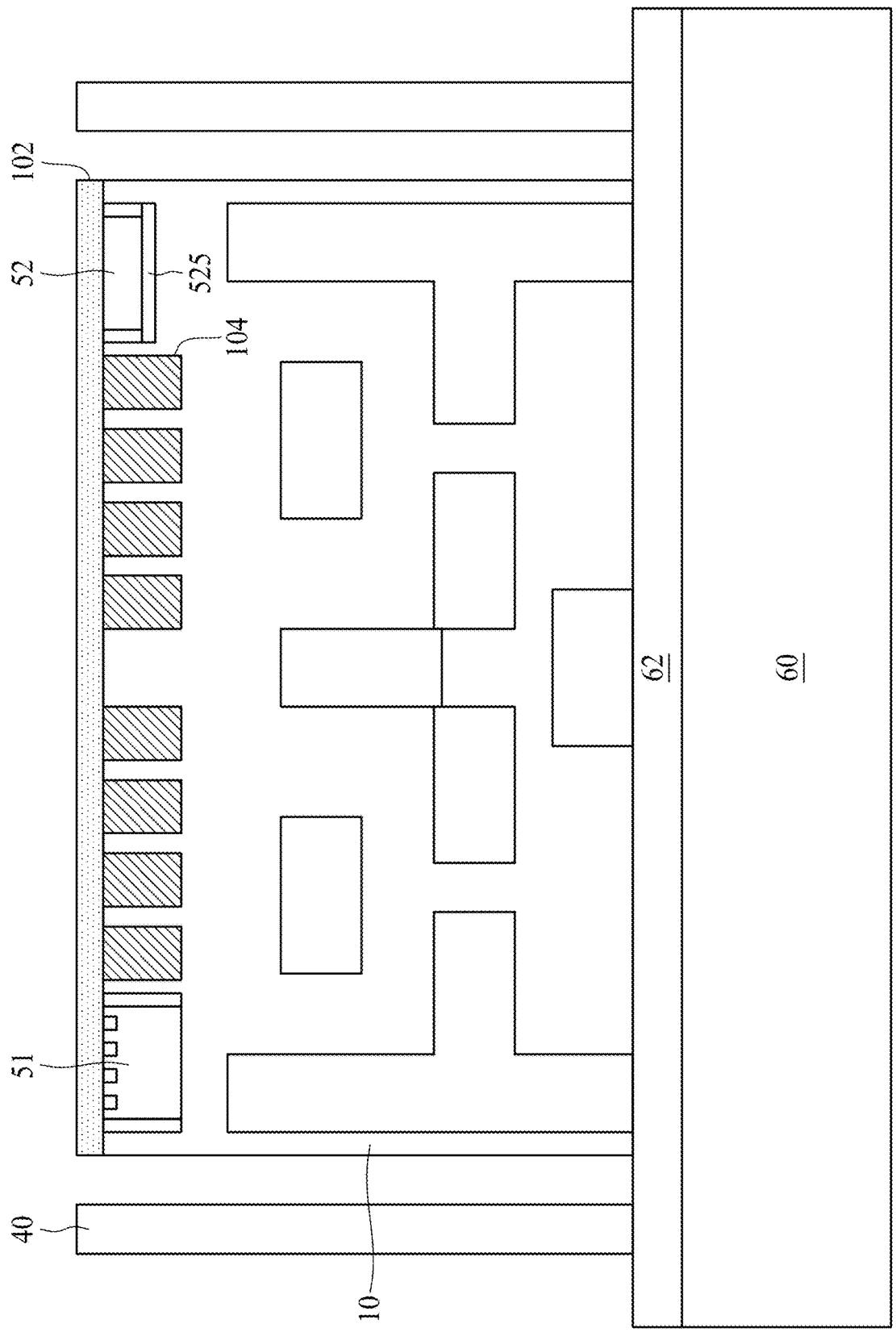

Referring to FIG. 6E, a carrier 60 is provided. A release film 62 is formed on the carrier 60. A support ring 40 is then attached to the release film 62. Subsequently, a substrate 10 provided with a buffer layer 102 and embedded devices 51, 52 is attached to the release film 62. The substrate 10 is substantially surrounded by the support ring 40.

Figure 6F:
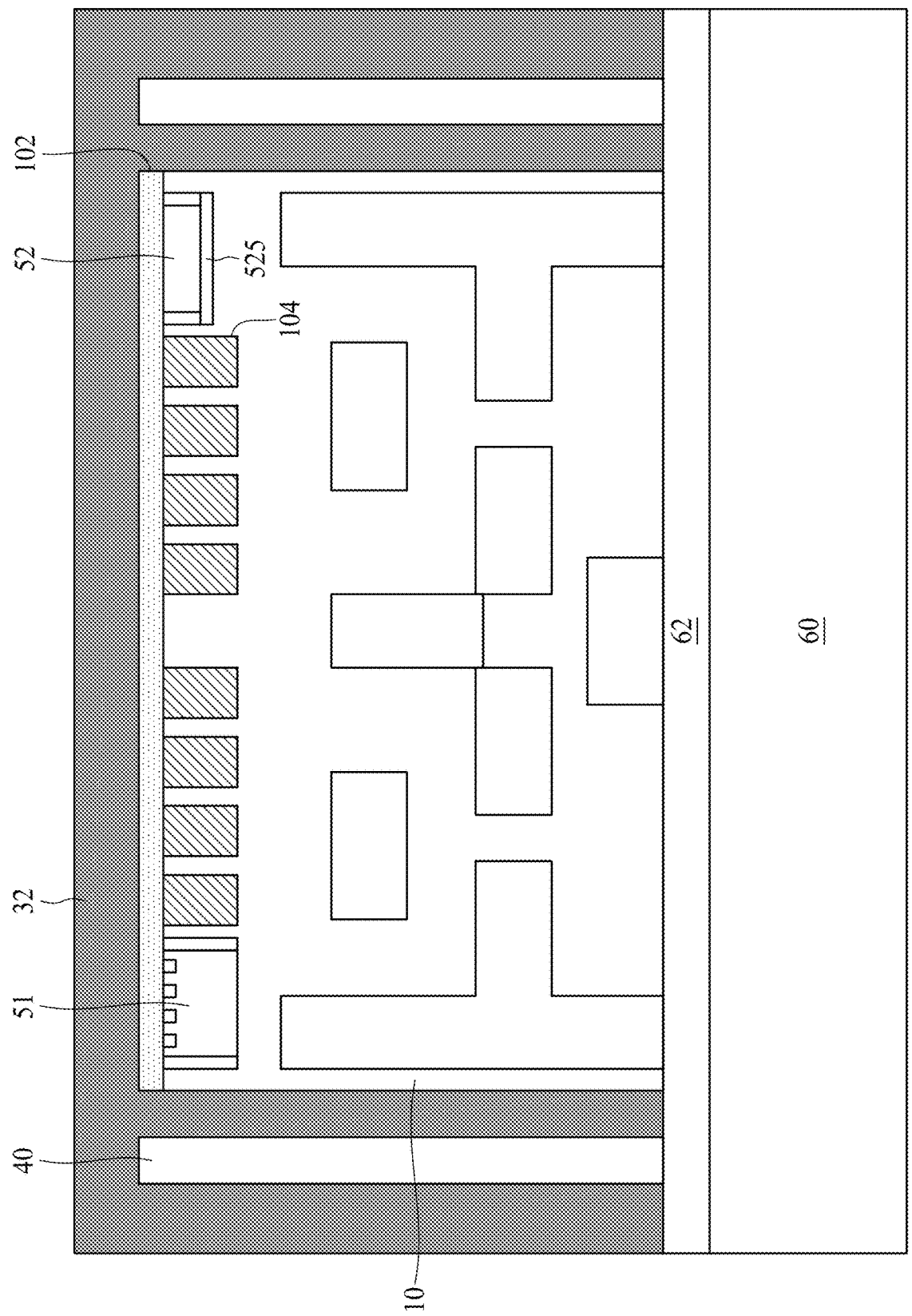

Referring to FIG. 6F, an encapsulating layer 32 is formed on the release film 62, covering the substrate 10 and the support ring 40.

Figure 6G:
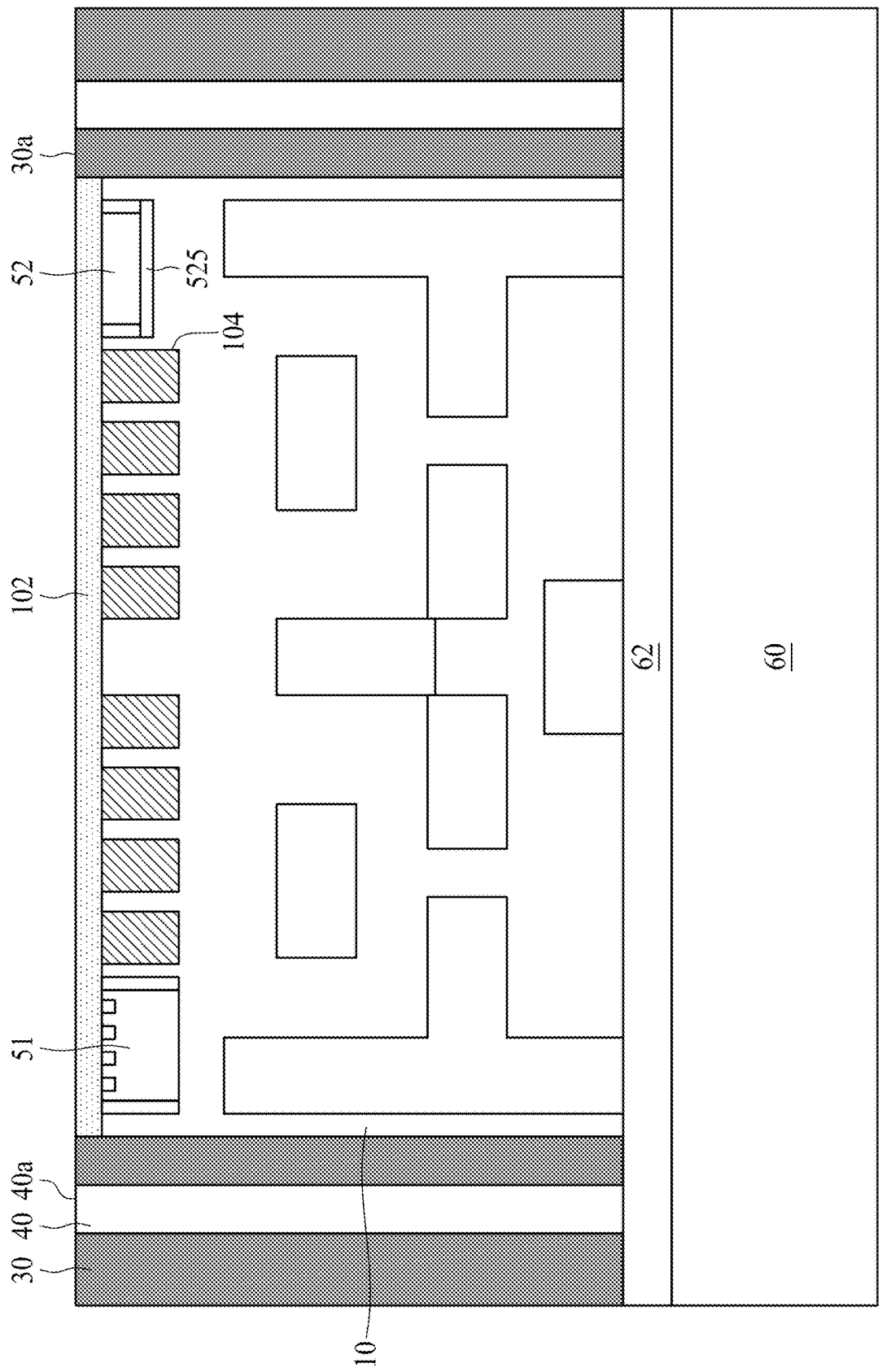

Referring to FIG. 6G, the encapsulating layer 32 is reduced in height, resulting in a reduced encapsulating layer 30. The reduced encapsulating layer 30 exposes from a first surface 30a thereof the buffer layer 102. The buffer layer 102 is substantially level with the first surface 30a of the reduced encapsulating layer 30. In addition, the reduced encapsulating layer 30 may optionally expose the first surface 40a of the support ring 40. The second surface 40b of the support ring 40 is substantially level with a second surface 30b of the reduced encapsulating layer 30. In addition, the reduced encapsulating layer 30 surrounds the substrate 10.

Figure 6H:
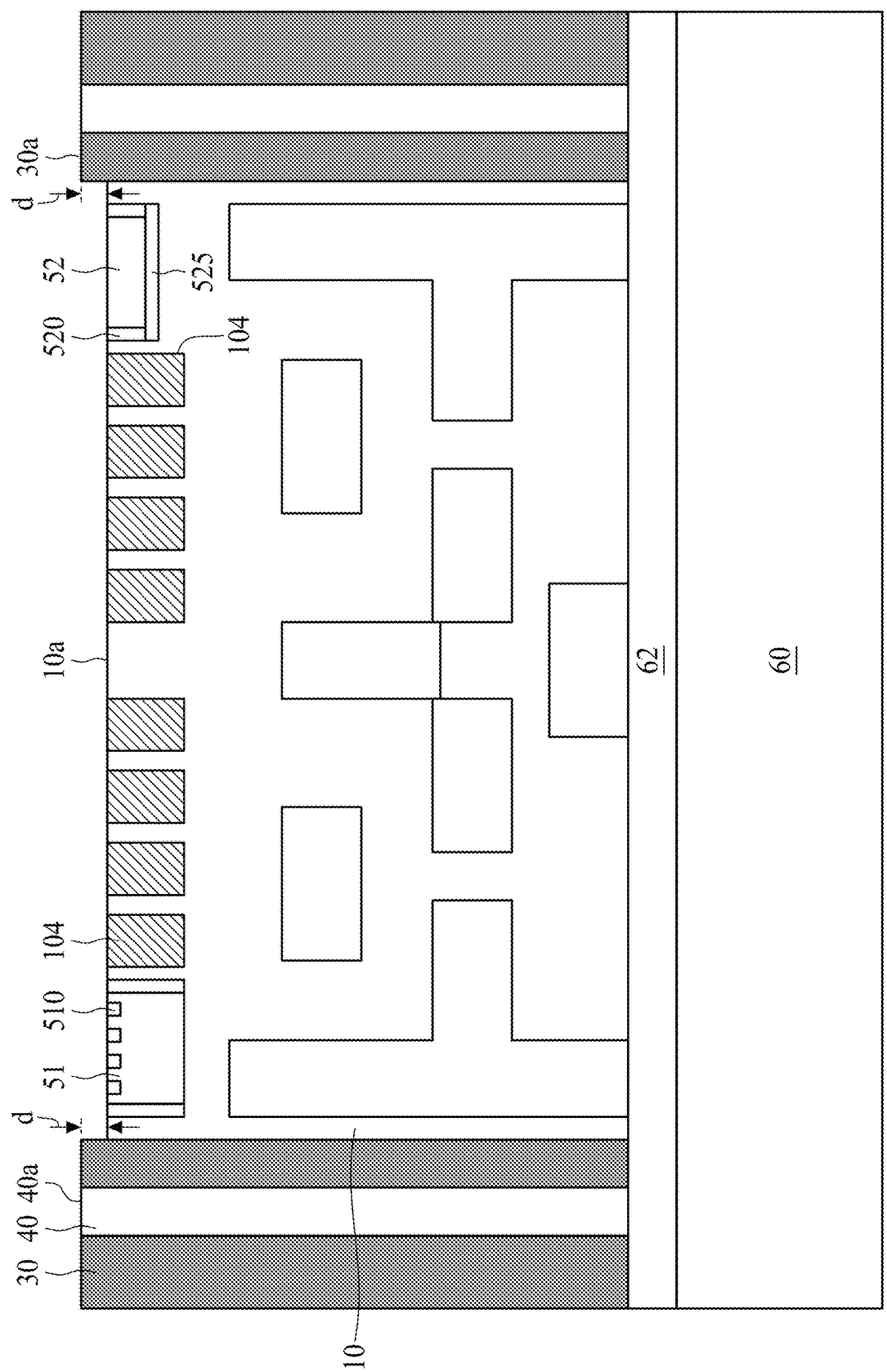

Next, referring to FIG. 6H, the buffer layer 102 is removed, exposing the contact pads 104 at the first surface 10a of the substrate 10, the conductive pads 510 of the first device 51, and the electrodes 520 of the second device 52. Removal of the buffer layer 102 results in a gap "d" between the first surface 10a of the substrate 10 and the first surface 30a of the reduced encapsulating layer 30. As a result, the gap "d" substantially equals the thickness of the buffer layer 102. Furthermore, as previously discussed, the first surface 10a of the substrate 10 is smaller in surface roughness than the first surface 30a of the reduced encapsulating layer 30.

Figure 6I:
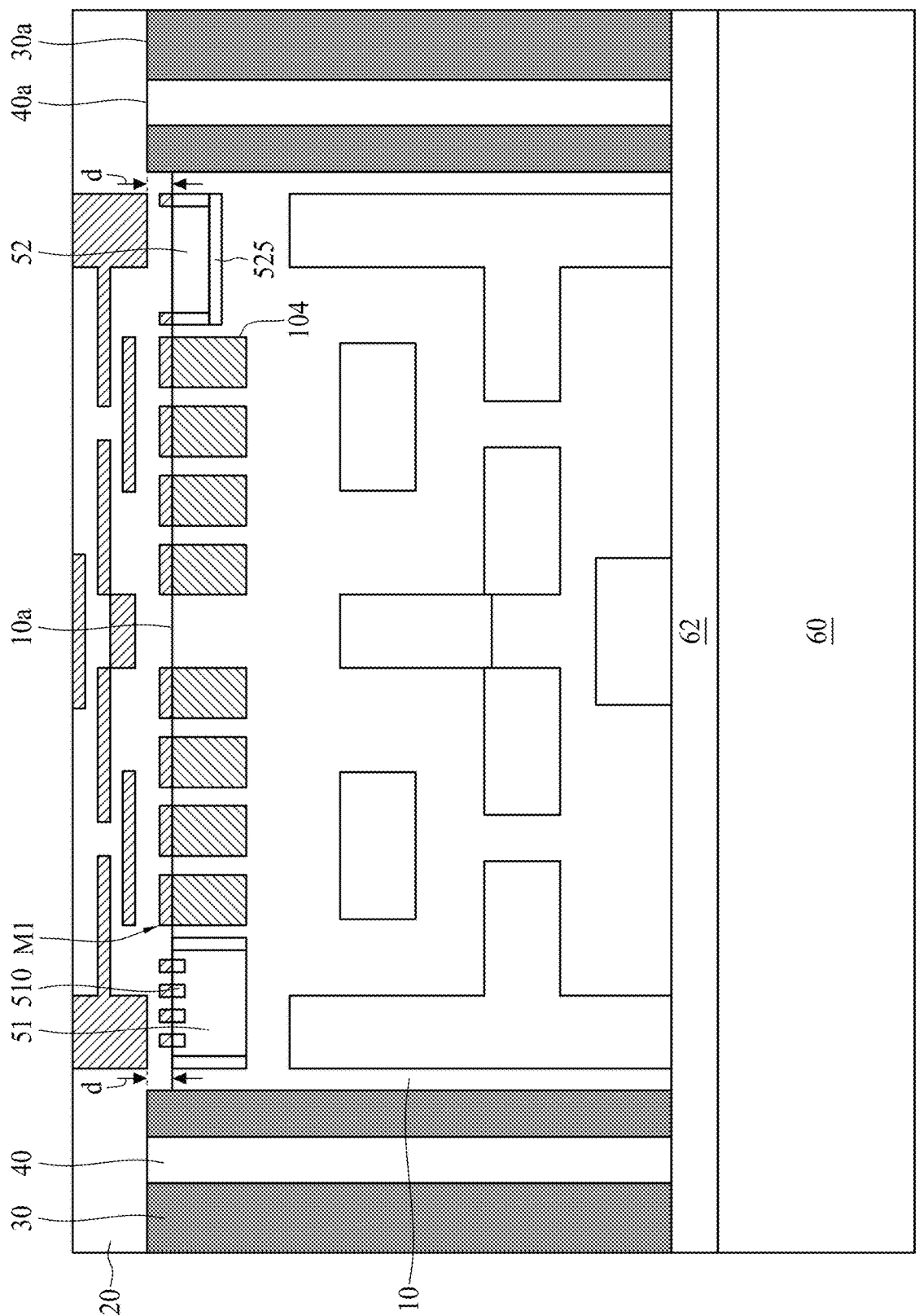
Figure 6J:
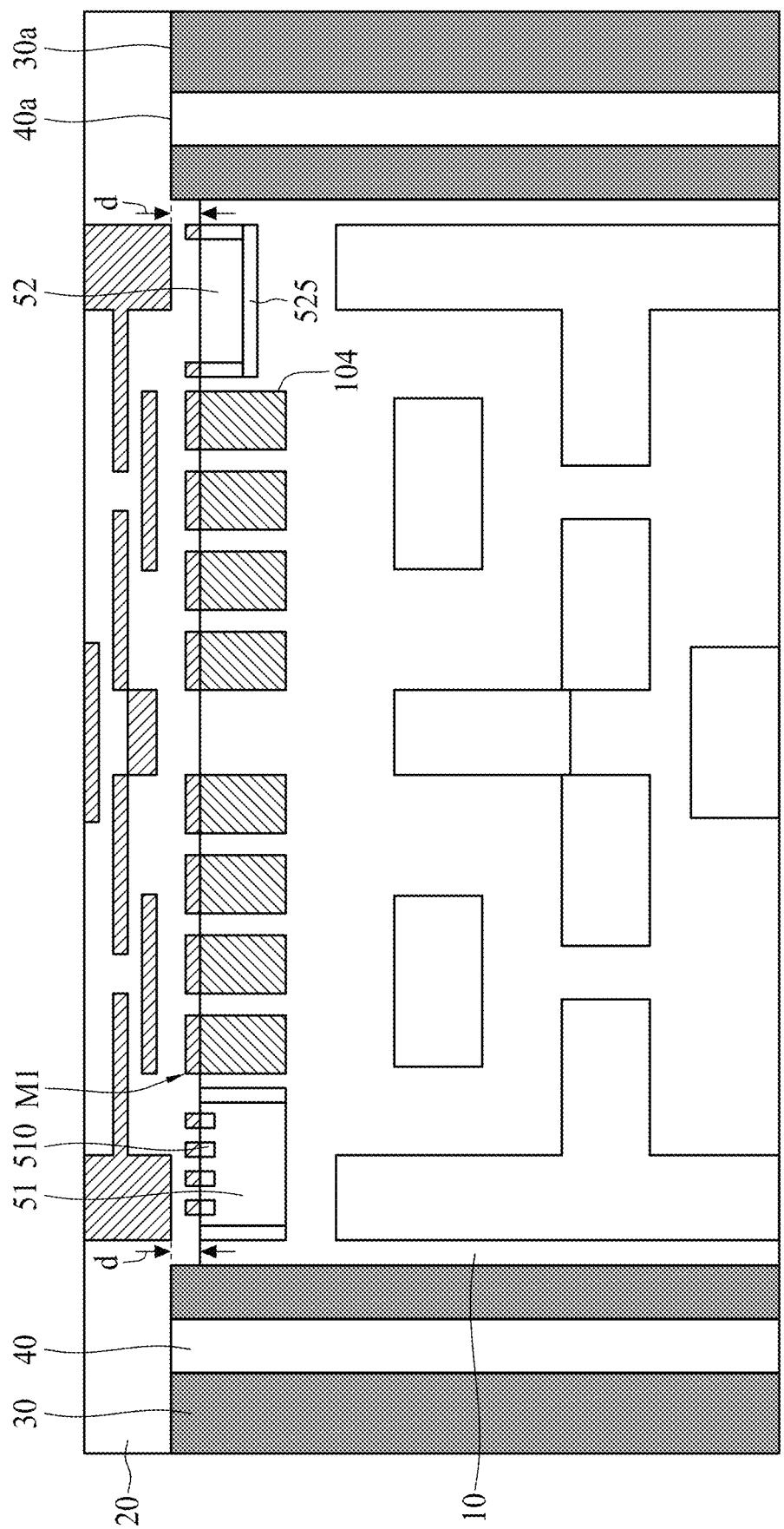

Referring to FIG. 6I, a redistribution structure 20 is formed on the first surface 30a of the reduced encapsulating layer 30, the contact pads 104 and the first surface 10a of the substrate 10. Also referring to FIG. 3, in an embodiment, in the redistribution structure 20 a first dielectric layer PA1 fills the gap d, while a first conductive layer M1 is disposed on the first surface 10a of the substrate 10 in the gap d. In addition, the first conductive layer M1 is electrically connected to the conductive pads 510 of the first device 51 and the electrodes 520 of the second device 52. After the redistribution structure 20 is formed, the carrier 60 together with the release film 62 is removed, as illustrated in FIG. 6J. Subsequently, a sawing process is conducted on the resultant structure in FIG. 6J along cutting lines on the redistribution structure 20. The sawing process removes portions of the redistribution structure 20 and the reduced encapsulating layer 30, resulting in a substrate structure 300 as described and illustrated with reference to FIG. 3.

Like the exemplary method in FIGS. 4A to 4H, the exemplary manufacturing method as described and illustrated with reference to FIGS. 6A to 6J alleviates or solves the issues or problems that would occur in the comparative approaches due to via drilling, underfill application or non-recyclable carrier. The exemplary method in FIGS. 6A to 6J thus also provides a reliable, eco-friendly and cost efficient manufacturing process.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate structure, comprising:
a substrate having a first surface;
an encapsulating layer disposed on the substrate, the encapsulating layer having a first surface and an opening exposing the first surface of the substrate;
a redistribution structure disposed on the first surface of the substrate and extending into the opening of the encapsulating layer, wherein the opening has a gap in elevation between the first surface of the substrate and the first surface of the encapsulating layer; and further comprising a support ring sealed in the encapsulating layer and laterally encompassing the substrate, wherein the support ring has a first surface, the first surface of the support ring being substantially level with the first surface of the encapsulating layer.

2. The substrate structure of claim 1, wherein the redistribution structure includes a first dielectric layer extending in the opening of the encapsulating layer and disposed on the first surface of the substrate and the first surface of the encapsulating layer.

3. The substrate structure of claim 2, wherein the first dielectric layer includes a first portion disposed on the first surface of the substrate and a second portion disposed on the first surface of the encapsulating layer and on the first portion.

4. The substrate structure of claim 3, wherein the first portion has a thickness substantially equal to the gap.

5. The substrate structure of claim 1, wherein the redistribution structure is disposed on the first surface of the support ring, the first surface of the encapsulating layer and the first surface of the substrate.

6. The substrate structure of claim 1 further comprising a first device embedded in a first recess of the substrate, wherein the first recess has a first depth from the first surface of the substrate, the first device including one of an active device or a passive device.

7. The substrate structure of claim 6 further comprising a second device embedded in a second recess of the substrate, wherein the second recess has a second depth from the first surface of the substrate, the second device including one of an active device or a passive device, and the second depth being different from the first depth.

8. A substrate structure, comprising:
a substrate having a first surface;
an encapsulating layer disposed on the substrate, the encapsulating layer having a first surface and an opening exposing the first surface of the substrate;
a support ring sealed in the encapsulating layer and laterally encompassing the substrate, the support ring having a first surface; and
a redistribution structure disposed on the first surface of the substrate and extending into the opening of the encapsulating layer,
wherein the opening has a gap in elevation between the first surface of the substrate and the first surface of the encapsulating layer.

9. The substrate structure of claim 8, wherein the redistribution structure includes a first dielectric layer extending in the opening of the encapsulating layer and disposed on the first surface of the substrate, the first surface of the encapsulating layer and the first surface of the support ring.

10. The substrate structure of claim 9, wherein the first dielectric layer includes a first portion disposed on the first surface of the substrate and a second portion disposed on the first surface of the encapsulating layer, the first surface of the support ring and on the first portion.

11. The substrate structure of claim 10, wherein the first portion has a thickness substantially equal to the gap.

12. The substrate structure of claim 8 further comprising a first device embedded in a first recess of the substrate, wherein the first recess has a first depth from the first surface of the substrate, the first device including one of an active device or a passive device.

13. The substrate structure of claim 12 further comprising a second device embedded in a second recess of the substrate, wherein the second recess has a second depth from the first surface of the substrate, the second device including one of an active device or a passive device, and the second depth being different from the first depth.

14. The substrate structure of claim 1, wherein the substrate includes contact pads beneath the first surface of the substrate, and the redistribution structure includes a first conductive layer disposed within the opening of the encapsulating layer and disposed on the first surface of the substrate in electrical connection with the contact pads.

15. The substrate structure of claim 1, wherein the support ring includes a thermally conductive material.

16. The substrate structure of claim 6, wherein the redistribution structure includes a first conductive layer disposed on the first surface of the substrate in electrical connection with the first device.

17. The substrate structure of claim 12, wherein the redistribution structure includes a first conductive layer disposed on the first surface of the substrate in electrical connection with the first device.

18. The substrate structure of claim 14, wherein a thickness of the first conductive layer is less than or equal to the gap.

19. The substrate structure of claim 8, wherein the redistribution structure includes a first conductive layer having a thickness less than or equal to the gap.

* * * * *